United States Patent [19]
Osawa

[11] Patent Number: 6,080,965
[45] Date of Patent: Jun. 27, 2000

[54] SINGLE-SUBSTRATE-HEAT-TREATMENT APPARATUS IN SEMICONDUCTOR PROCESSING SYSTEM

[75] Inventor: Tetsu Osawa, Sagamihara, Japan

[73] Assignee: Tokyo Electron Limited, Tokyo, Japan

[21] Appl. No.: 09/150,300

[22] Filed: Sep. 9, 1998

[30] Foreign Application Priority Data

Sep. 18, 1997 [JP] Japan .................................. 9-272074
Sep. 18, 1997 [JP] Japan .................................. 9-272075

[51] Int. Cl.$^7$ ...................................................... A21B 1/00
[52] U.S. Cl. ........................ 219/405; 219/411; 219/390; 118/725
[58] Field of Search .................................. 219/405, 411; 392/416, 418, 407; 118/725, 50.1; 250/492.22; 362/298, 301, 302, 304

[56] References Cited

U.S. PATENT DOCUMENTS

| | | | |
|---|---|---|---|
| 3,763,348 | 10/1973 | Costello | 219/347 |
| 4,427,723 | 1/1984 | Swain | 427/53.1 |
| 4,436,985 | 3/1984 | Weber | 219/388 |
| 4,498,926 | 2/1985 | Cline | 75/65 ZM |
| 4,694,143 | 9/1987 | Nishimura et al. | 219/388 |
| 4,711,790 | 12/1987 | Morishige | 427/10 |
| 4,859,832 | 8/1989 | Uehara et al. | 219/411 |
| 4,981,815 | 1/1991 | Kakoschke | 437/173 |
| 5,073,698 | 12/1991 | Stultz | 219/405 |
| 5,368,647 | 11/1994 | Suzuki | 118/723 I |
| 5,369,557 | 11/1994 | Ronney | 362/285 |
| 5,440,423 | 8/1995 | Ogura | 359/365 |
| 5,719,991 | 2/1998 | Sandhu et al. | 392/416 |

FOREIGN PATENT DOCUMENTS

| | | |
|---|---|---|
| 63-208747 | 8/1988 | Japan . |
| 2-42311 | 3/1990 | Japan . |
| 2-134542 | 11/1990 | Japan . |
| 2-150754 | 12/1990 | Japan . |

*Primary Examiner*—Teresa Walberg
*Assistant Examiner*—Shawntina Fuqua
*Attorney, Agent, or Firm*—Oblon, Spivak, McClelland, Maier & Neustadt, P.C.

[57] ABSTRACT

A single-substrate-heat-treatment apparatus heats a semiconductor wafer by scanning the wafer with light having high energy density. Light emitted by a light source is reflected by a reflection mirror mechanism, and is then focused on the surface of the wafer on a work table via a transparent window of a process chamber. During heat treatment, the work table or reflection mirror mechanism is moved to scan the wafer surface with the light coming from the light source.

17 Claims, 23 Drawing Sheets

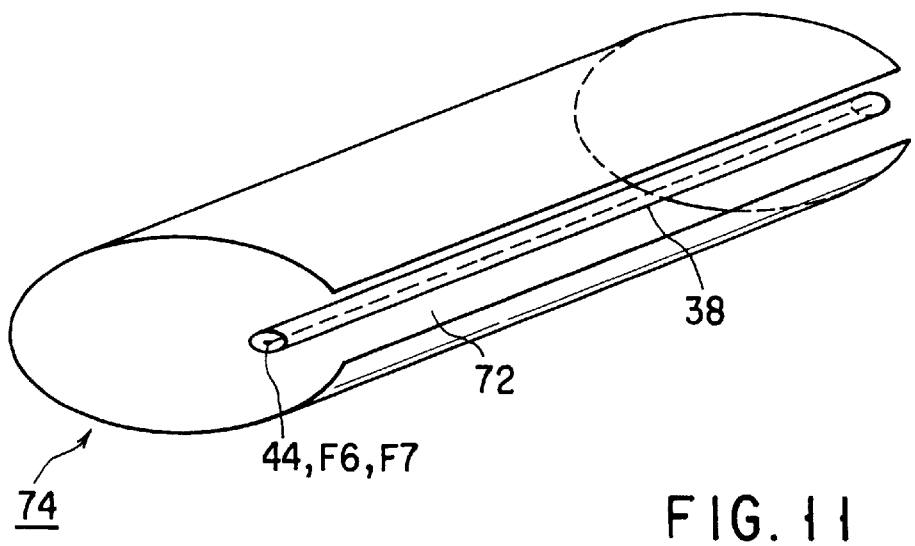
FIG. 11
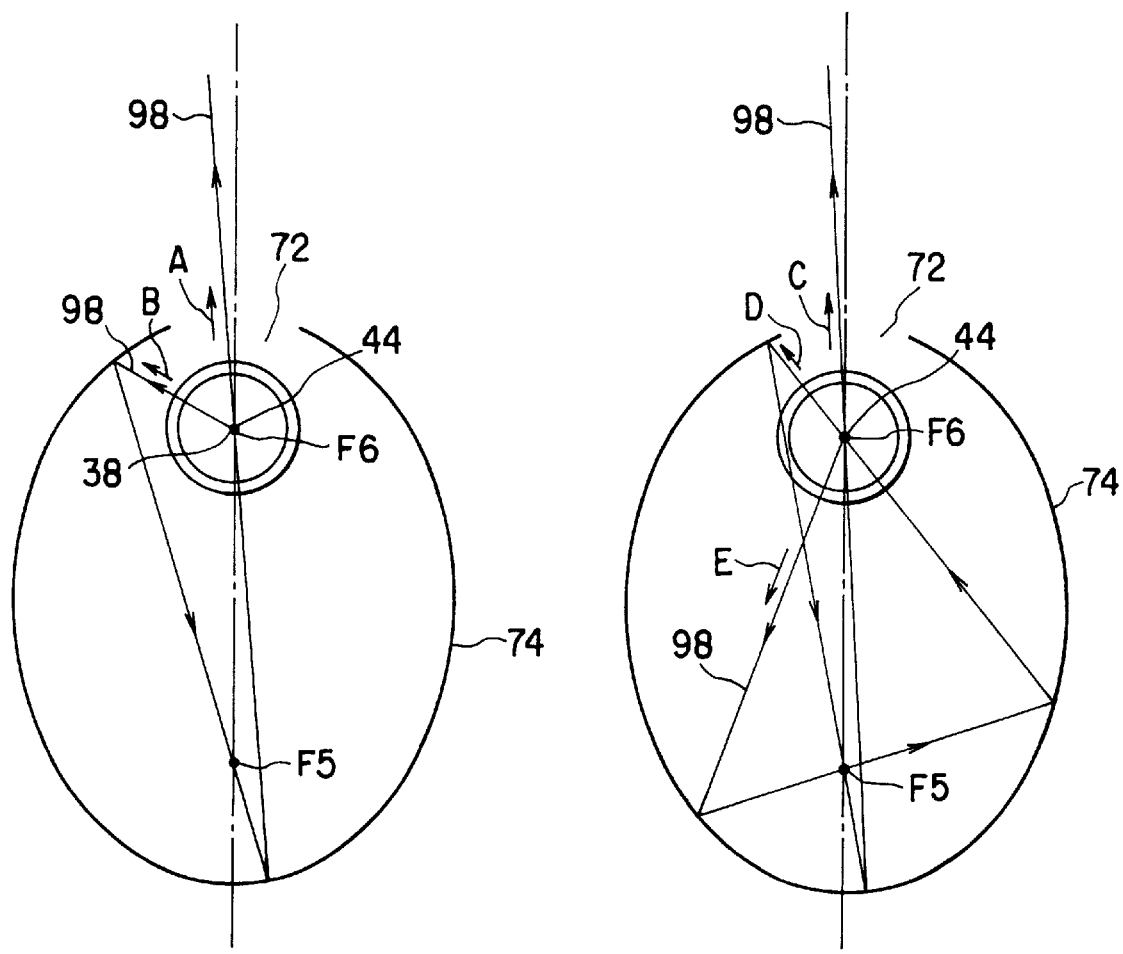
FIG. 12A
FIG. 12B

SINGLE-SUBSTRATE-HEAT-TREATMENT APPARATUS IN SEMICONDUCTOR PROCESSING SYSTEM

BACKGROUND OF THE INVENTION

The present invention relates to a single-substrate-heat-treatment apparatus for heat-treating the target substrate one by one in a semiconductor processing system and, more particularly, to a heat-treatment apparatus which uses a light source as a heat source for the target substrate. The term "semiconductor processing" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

As an apparatus for performing a predetermined process while heating a target substrate, such as a semiconductor wafer, one by one, a single-substrate film formation apparatus and an annealing apparatus are known. In a heat-treatment apparatus of this type, a strong resistive heater or a plurality of strong heating lamps are disposed above or below the wafer so as to heat the wafer in a process chamber.

The single-substrate-heat-treatment apparatus is required to heat and cool a wafer at high speed. This is because the single-substrate-heat-treatment apparatus processes wafers one by one, while a batch heat-treatment apparatus simultaneously process nearly 100 wafers. To obtain equivalent throughput, the single-substrate-heat-treatment apparatus must make heat and cool at a speed 100 times that of the batch heat-treatment apparatus.

The technical difficulty upon constructing the single-substrate-heat-treatment apparatus lies in that high planar uniformity of wafer temperature must be realized while providing high heating/cooling performance that can assure high throughput. For example, if the apparatus is covered by a heat-insulating material, high uniformity of wafer temperature is assured but cooling performance impairs, thus obstructing the function of the apparatus. For this reason, the single-substrate-heat-treatment apparatus requires a combination of a heat source having high heating performance and a chamber having sufficiently high cooling performance.

In a conventional single-substrate-heat-treatment apparatus, not only a wafer but also a work table having higher heat capacity than the wafer must be heated to a predetermined process temperature, and must be cooled immediately upon completion of the process. Hence, most of electric power consumed is wasted. For example, in the conventional single-substrate-heat-treatment apparatus, electric power as high as 40 to 50 kW must be input upon heating. Also, upon cooling, a considerably long time period is required since the work table must also be cooled, resulting in low throughput.

The resistance to heat conduction between the wafer and work table has a large variation that depends on their local contact states. Such variation seriously disturbs the planar uniformity of wafer temperature. Also, when the temperatures of internal structures other than the wafer, such as the work table, the inner wall of the process chamber, a shower head for supplying a gas, and the like rise, reaction products also adhere to these internal structures (especially, in a film formation process). Such reaction products increase the frequency of maintenance such as cleaning.

Furthermore, the single-substrate-heat-treatment apparatus is required to have high planar uniformity of wafer temperature. If the planar uniformity of wafer temperature is low, the conductivity of a crystal obtained by annealing varies, the thicknesses of films formed have variations, and so on. To prevent this, it is important for the a process accompanying wafer heating to maintain high planar uniformity of wafer temperature.

In the conventional single-substrate-heat-treatment apparatus, for example, a plurality of thermocouples (e.g., three thermocouples at positions corresponding to the center, middle portion, and outer periphery of the wafer, or a large number of thermocouples over the entire wafer surface) are disposed to measure the wafer temperature. Based on the measurement results, inputs to be given to resistive heaters or heating lamps corresponding to the nonuniform wafer temperature portions are controlled, thus maintaining high planar uniformity of wafer temperature.

However, even when a given temperature distribution in the wafer surface is detected using several or a large number of thermocouples, such temperature distribution is a very rough one. In a conventional heating mechanism using resistive heaters or heating lamps, the heat input amounts can be controlled in units of a heater zone or individual lamps, but each area to be controlled is too broad to control the temperature of a specific portion.

BRIEF SUMMARY OF THE INVENTION

It is an object of the present invention to provide a single-substrate-heat-treatment apparatus which can heat and cool a wafer at high speed.

It is another object of the present invention to provide a single-substrate-heat-treatment apparatus which can perform a process with high planar uniformity of wafer temperature.

According to a first aspect of the present invention, there is provided a single-substrate-heat-treatment apparatus in a semiconductor processing system. This apparatus comprises a process chamber formed in a casing with a transparent window; a support disposed in the process chamber, for supporting a target substrate to face the transparent window; a light source disposed outside the process chamber, for emitting light to heat the target substrate; a reflection mirror mechanism for reflecting light emitted by the light source and radiating the reflected light onto the target substrate via the transparent window, the reflection mirror mechanism comprising an objective mirror disposed to face the transparent window to focus the light emitted by the light source onto the target substrate; and a scanning mechanism for driving at least one of the support and reflection mirror mechanism to scan the target substrate with the light emitted by the light source.

According to a second aspect of the present invention, there is provided a single-substrate-heat-treatment apparatus in a semiconductor processing system. This apparatus comprises a process chamber formed in a casing with a transparent window; a support disposed in the process chamber, for supporting a target substrate to face the transparent window; a main heating mechanism for heating the target substrate; a scanning radiation temperature measurement mechanism located outside the process chamber, for measuring a temperature distribution of the target substrate via the transparent window; and a sub heating mechanism for selectively and locally heating the target substrate on the basis of the temperature distribution measured by the radiation temperature measurement mechanism.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 11 is a perspective view showing the relationship between the light source and elliptic reflection mirror in the apparatus shown in FIG. 9;

FIGS. 12A and 12B are explanatory views for explaining the paths of light rays in the elliptic reflection mirror;

DETAILED DESCRIPTION OF THE INVENTION

Figure 1:
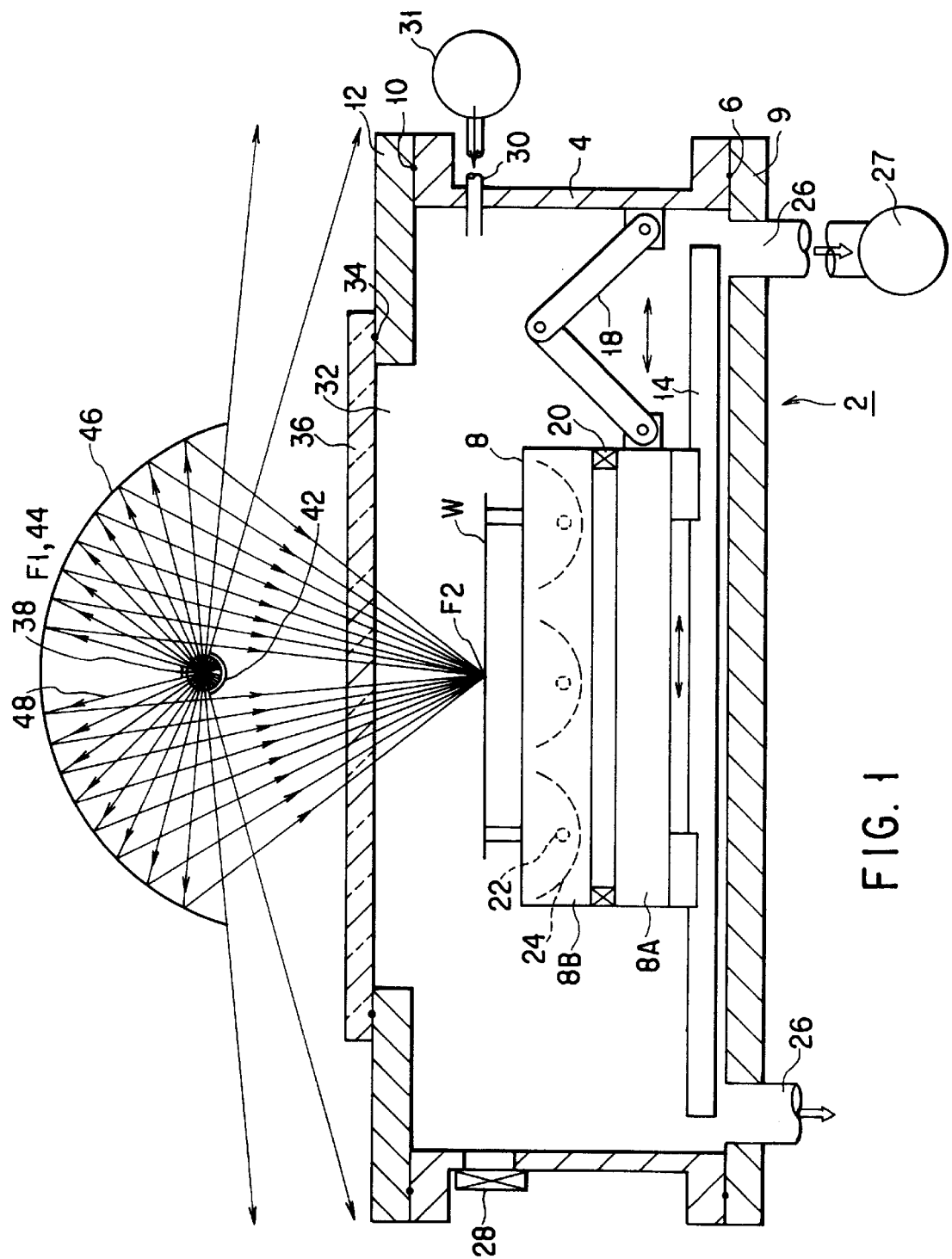
FIG. 1 is a view showing a single-substrate-heat-treatment apparatus according to an embodiment of the present invention.

The first aspect of the present invention relates to a single-substrate-heat-treatment apparatus which heats the target substrate by scanning the target substrate by light with high energy density. Upon making the present invention, the present inventor has found the facts to be described below as a result of comparison tests between a single-substrate-heat-treatment apparatus of this type to which the present invention is applied, and a conventional single-substrate-heat-treatment apparatus which heats the target substrate using a resistive heater or a plurality of heating lamps.

In the conventional apparatus, it is hard to maintain the target substrate at, e.g., high temperatures exceeding 1,000° C. in consideration of the heat resistances of the surrounding materials, and its processing temperature becomes relatively low. At such low processing temperatures, the physical properties of the target substrate obtained by the heat treatment, the thickness of a film to be deposited or formed, and the like are influenced stronger by temperature than other factors. In this case, it is very important to obtain high uniformity of the target substrate temperature.

On the other hand, at high processing temperatures, the physical properties of the target substrate obtained by the heat treatment, the thickness of a film to be deposited and formed, and the like are determined by the time period during which that temperature can be maintained or the amount of source gas adsorbed by the surface of the target substrate, and are influenced little by the temperature to which the substrate is exposed. When scanning at a proper speed with light having very high energy density, only the surface of the target substrate can be maintained at a high temperature beyond 1,000° C. for a predetermined time period determined by the scanning speed. For this reason, the physical properties of the target substrate obtained by the heat treatment, the thickness of a film to be deposited and formed, and the like can be maintained constant, i.e., uniform.

More specifically, scanning and irradiating the surface of the target substrate with light having very high energy density at a proper speed, a predetermined process can be uniformly done while rapidly heating the surface of the target substrate alone without heating the entire target substrate. In the apparatus of this type, as the energy density becomes higher, the effect of heating the only the surface of the target substrate, e.g., a wafer, becomes more conspicuous, and the time required for heating up to a predetermined temperature shortens synergistically. In this case, the minimum required energy density for surface melting is 500 W/cm$^2$, preferably, 4000 W/cm$^2$ or higher, and most preferably, 30,000 W/cm$^2$ or higher. For example, light with an energy density of 4,000 W/cm$^2$ can rapidly heat a wafer to the melting temperature of silicon in 21 ms. In an existing single-substrate-heat-treatment apparatus, the entire surface of a wafer is heated by an energy density as low as, e.g., 30 W/cm$^2$, and the above-mentioned energy density is a very high value.

An embodiment of the present invention made based on the aforementioned facts will be explained hereinafter with reference to the accompanying drawings. Throughout the following description, the same reference numerals denote constituting elements having nearly the same functions and arrangements, and a repetitive description will be avoided unless required.

FIG. 1 is a view showing a single-substrate-heat-treatment apparatus according to an embodiment of the present invention.

As shown in FIG. 1, a heat-treatment apparatus 2 has a process chamber 4 which is formed into a cylindrical shape by, e.g., aluminum or the like. A bottom plate 9 is air-tightly attached to the bottom portion of the process chamber 4 via a seal member 6 such as an O-ring or the like. Also, a top plate 12 is air-tightly attached to the top portion via a seal member 10 such as an O-ring or the like. In the process chamber 4, a work table 8 for placing, e.g., a semiconductor wafer W as the target substrate is set.

The work table 8 is constructed by a lower base 8A and a work table main body 8B set thereon. The base 8A is slidably set on two guide rails 14 (one of them is shown in FIG. 1) extending on the bottom plate 9 via slide blocks 16. Note that the slide mechanism is not limited to the illustrated structure.

An extendable scanning arm 18 for driving is coupled between the base 8A and the side wall of the process chamber 4. Upon extending/contracting the scanning arm 18, the whole work table 8 moves, and the wafer surface can be scanned with the focal point of light.

Figure 2:
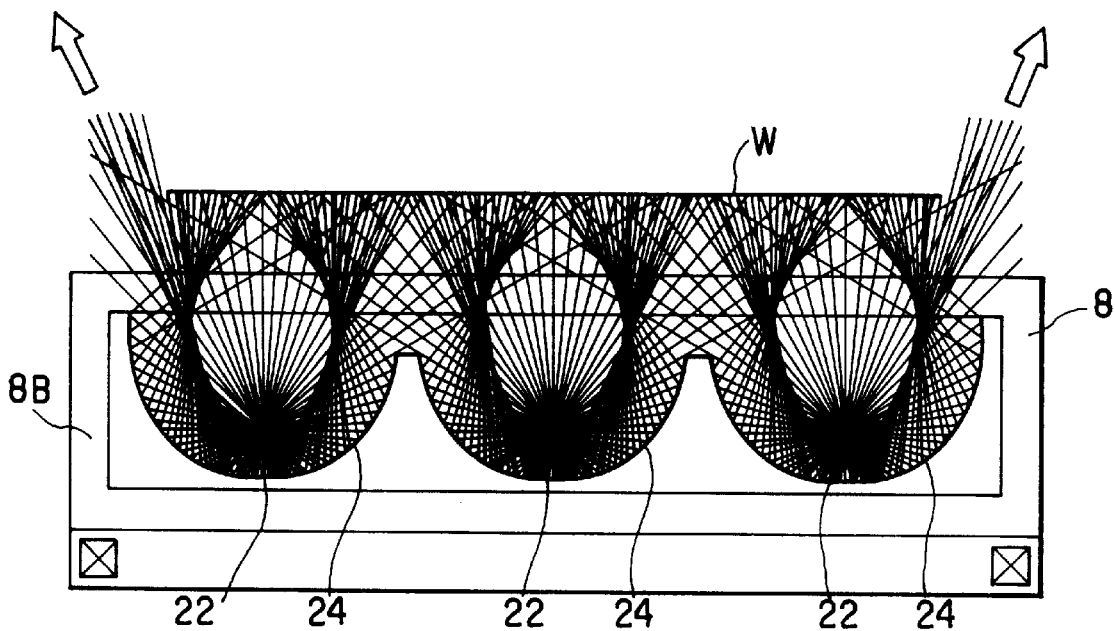
FIG. 2 is a view showing a heating mechanism of a work table in the apparatus shown in FIG. 1.

The work table main body 8B is set on the base 8A via, e.g., a circular bearing 20, and is rotatable in the circumferential direction. At least the upper surface of the work table main body 8B consists of transparent quartz glass. As also shown in FIG. 2, a plurality of auxiliary heating lamps 22 for pre-heating are disposed inside the work table main body 8B. With these lamps 22, the wafer W can be heated from its back surface side. The input electric power amounts of these lamps 22 can be individually controlled. Below the lamps 22, reflection mirrors 24 each having a curved-surface section similar to a nearly elliptic or parabolic shape are disposed. With these mirrors, light emitted by the lamps 22 can be efficiently radiated onto the back surface of the wafer.

The reflection surface of each reflection mirror 24 has a curved-surface shape which scatters light rays that reach the wafer rear surface roughly uniformly, unlike an elliptic or parabolic reflection mirror popularly used. Note that resistive heaters may be used in place of the lamps 22. Alternatively, the wafer may be heated by a light source (to be described later) alone without arranging the lamps 22 and reflection mirrors 24.

Exhaust ports 26 connected to a vacuum evacuation system 27 are formed in the bottom plate 9 of the process chamber 4, so that the interior of the process chamber 4 can be evacuated to a vacuum. A gate valve 28 which is opened/closed upon loading/unloading the wafer W is attached to the side surface of the process chamber 4. Also, a gas supply nozzle 30 connected to a gas supply system 31 is inserted into the side wall of the process chamber 4 so as to supply a predetermined process gas.

Also, lifter pins (not shown) for vertically moving the wafer W to convey it may be arranged if necessary. In place of the gas supply nozzle 30, a transparent, quartz shower head may be used.

An opening 32 with a predetermined size is formed in the top plate 12 of the process chamber 4. A transparent window 36 formed of, e.g., quartz, is air-tightly set on the opening 32 via a seal member 34 such as an O-ring or the like.

A light source 38 and a reflection mirror mechanism 40 for heating the front surface of the wafer W is set above the transparent window 36. More specifically, the light source 38 and reflection mirror mechanism 40 are formed to have a length nearly equal to or slightly larger than the wafer diameter to cover the diameter of the wafer W, as also shown in FIG. 3.

The light source 38 comprises, e.g., a halogen lamp prepared by arranging a linearly wound filament in a linear glass tube 42 having a predetermined diameter, or a discharge lamp (e.g., xenon lamp, metal halide lamp, or the like) for emitting light by arc discharge by arranging electrodes on the two ends in the glass tube 42.

The halogen lamp or discharge lamp forms an emission line 44 for emitting light. The sectional diameter of the emission line 44 is as large as, e.g., 3 mm if the filament is used. However, the sectional diameter of the emission line 44 produced by arc discharge is as very small as 0.1 to 0.3 mm. The discharge lamp has small angular errors or divergence angle upon focusing, and is preferable in realizing high energy density, as will be explained later.

Figure 3:
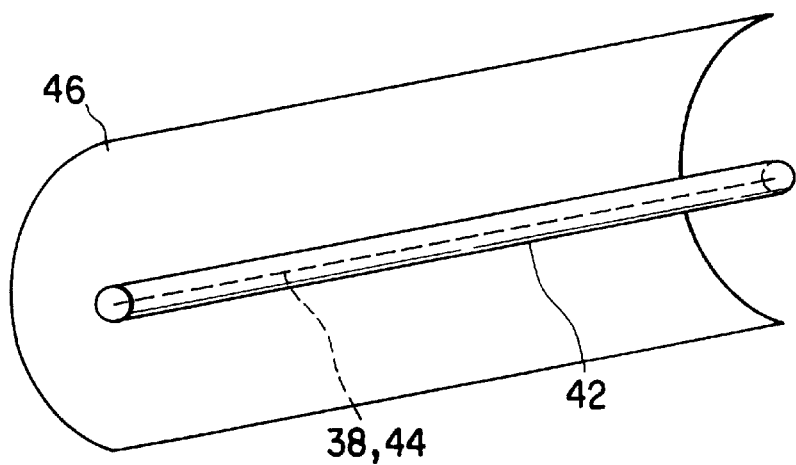
FIG. 3 is a perspective view showing a light source and a reflection mirror mechanism in the apparatus shown in FIG. 1.

As shown in FIG. 3, the reflection mirror mechanism 40 has a semi-elliptic reflection mirror 46 having a nearly semi-elliptic section along the optical axis direction. The shape of the mirror 46 is set so that the emission line 44 of the light source 38 is located on a first focal point F1 of the elliptic shape of the mirror 46, and the wafer surface is located on a second focal point F2 corresponding to a converging portion.

The operation of the apparatus shown in FIG. 1 will be described below.

An unprocessed semiconductor wafer W is loaded into the process chamber 4 using a transfer arm (not shown) via the open gate valve 28, and is placed on the work table 8. After the interior of the process chamber 4 is sealed hermetically, the interior of the process chamber 4 is evacuated to a vacuum, and is maintained at a predetermined process pressure. At the same time, a predetermined process gas is supplied via the gas supply nozzle 30. At this time, the lamps 22 arranged inside the work table main body 8B are already in operation, and radiate light toward the back surface side of the wafer W to pre-heat it. In such circumstance, the light source 38 begins to operate and the scanning arm 18 is driven at the same time, thereby, e.g., reciprocally moving the work table 8 along the guide rails 14 at a predetermined scanning speed.

Of light 48 emitted from the emission line 44 in the glass tube 42, light which travels upward in FIG. 1 is reflected by the semi-elliptic reflection mirror 46, and is condensed as a linear spot on the second focal point F2, i.e., the wafer surface. At this time, the condensed light has a very high energy density. For example, when the halogen lamp is used as a light source, an energy density of approximately 500 W/cm$^2$ is realized; when the discharge lamp is used, 1,500 W/cm$^2$. In this way, the wafer surface alone can be rapidly heated up to a heat treatment temperature of, e.g., 1,000° C. Since light is condensed by a reflection mirror larger than the size of the light source, a spread of the focal point can be suppressed. Also, the energy density can be raised up to a value near the density of light rays in the vicinity of the filament or arc discharge as the emission line 44 of the light source 38. Hence, the wafer surface alone can be rapidly heated without so largely increasing the temperature of the entire wafer.

As described above, by extending/contracting the scanning arm 18, the wafer W is moved at a predetermined speed, and the entire wafer surface is scanned by a linear beam spot with high energy density. With this scanning, a predetermined heat process, such as annealing, film formation, impurity diffusion, oxidation, and the like can be done for the entire wafer surface. If desired heat treatment is done in a single scan, the wafer may crack. For this reason, scanning preferably repeats itself several times while a high scanning speed is set.

The light source 38 preferably uses a discharge lamp, the emission line 44 of which has a small sectional diameter. In this case, a linear spot having higher energy density than a filament lamp with a large sectional diameter can be obtained. This point will be explained below with reference to FIGS. 4 to 6.

Figure 4:
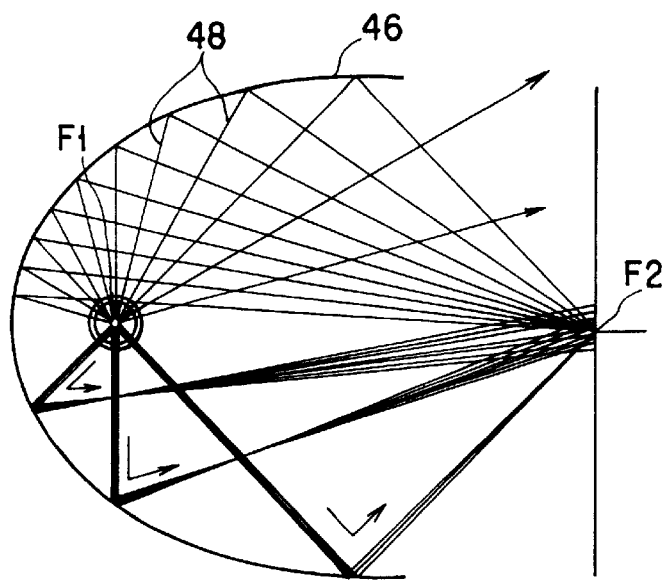
FIG. 4 shows the paths of light emitted by the light source shown in FIG. 3.
Figure 5:
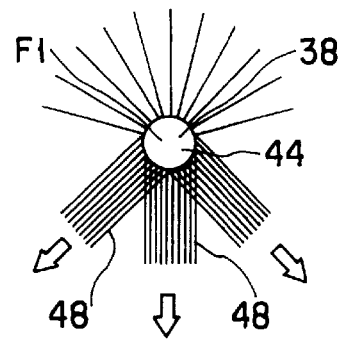
FIG. 5 is an enlarged view of the light source shown in FIG. 3.

The upper half of FIG. 4 shows the paths of light rays which originate from the center of the light source 38, are reflected by the semi-elliptic mirror 46, and reach the focal point F2. The lower half of FIG. 4 shows the ray tracing results of extracted light rays in −45°, −90°, and −135° directions toward the focal point F2 under the assumption that the light source 38 has a size of 2 mm.

Figure 6:
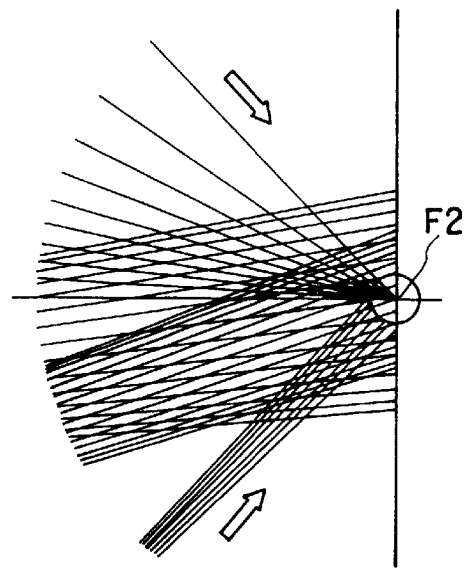
FIG. 6 is an enlarged view showing a converging portion of the apparatus shown in FIG. 1.

In practice, light rays are emitted from all the points on the perimeter in all the directions, but light rays in specific angles are extracted and illustrated. Emitted light rays 48 initially have a width corresponding to the size of the light source. However, after the light rays 48 are reflected by the semi-elliptic reflection mirror 46, the width decreases temporarily, and then becomes large at the focal point F2. A light ray located at the center of the light rays 48 reaches a position with a regular angle of the semi-elliptic mirror, and then reaches the focal point F2. However, a light ray located at the end of the width of the light rays 48 has a position error corresponding to the radius of the emission line 44, and the position error appears as an angular error after that light ray is reflected. For this reason, the light ray located at the end of the width of the light rays 48 produces a position error more than the radius of the emission line 44 at the focal point F2, so that the entire light rays seem to have a larger width at that point. Hence, as shown in FIG. 6, on the focal point F2 as a converging portion, the light rays 48 form a largely spread beam spot, and the energy density of light lowers accordingly.

The sectional diameter of the emission line 44 always assumes a finite value. Hence, if an arc discharge lamp with a very small sectional diameter is used as a light source, a spread of the beam spot can be controlled, and a linear beam spot with higher energy density can be realized.

In this embodiment, heat treatment is done by rapidly heating the wafer surface alone. Consequently, heating/cooling can be attained within a shorter period of time as compared to a case wherein both the entire wafer and the work table must be heated/cooled. As a result, the throughput can be improved, and wasteful energy to be input to a wafer as the target substrate can be reduced.

Also, no linear spot is formed on a portion other than the wafer surface. For this reason, no reaction products become attached to unwanted portions such as the work table 8, the side walls of the process chamber 4, and the like. Hence, the frequency of maintenance such as cleaning can be reduced accordingly.

Furthermore, as for the transparent window 36, the density of light rays transmitted through the window 36 is lower than that of the converging portion, and the window 36 has low absorbency. For this reason, the temperature of the transparent window 36 does not rise.

After the wafer W has been scanned an appropriate number of times by the scanning arm 18, the work table main body 8B alone is rotated, e.g., 90°. In this state, when the wafer is scanned again an appropriate number of times, the heat treatment can be uniformly performed over the entire wafer surface.

Figure 7:
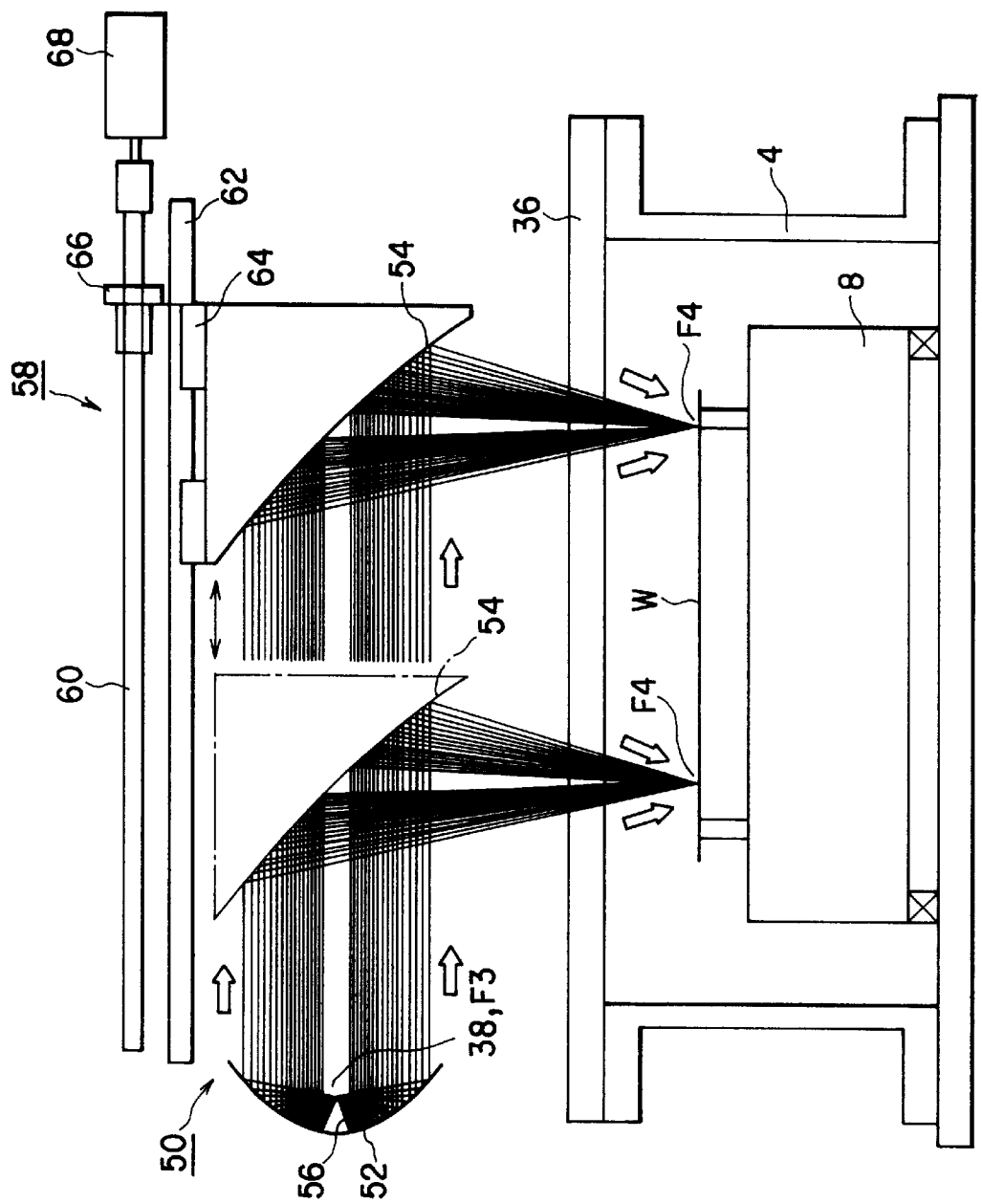
FIG. 7 is a view showing a single-substrate-heat-treatment apparatus according to another embodiment of the present invention.

FIG. 7 shows a single-substrate-heat-treatment apparatus according to another embodiment of the present invention. In the embodiments shown in FIGS. 7 to 21, the process chamber 4 side is simply illustrated.

As shown in FIG. 7, a lamp that forms a linear emission line as in the light source 38 of the apparatus shown in FIG. 1 is used as a light source. A reflection mirror mechanism 50 is formed of first and second parabolic reflection mirrors 52 and 54 each having a parabolic section along the optical axis direction.

More specifically, the light source 38 is set on a focal point F3 of the first parabolic reflection mirror 52, and light 56 emitted by the light source 38 is converted into collimated light. The collimated light is parallelly radiated to a region above the transparent window 36. The second parabolic reflection mirror 54 is set above the transparent window 36, and reflects the collimated light downward to focus the light on its focal point F4. The position of the reflection mirror 54 is adjusted so that the focal point F4 is formed on the surface of the semiconductor wafer W.

The second parabolic reflection mirror 54 is attached to a scanning mechanism 58. By reciprocally moving the reflection mirror 54, the wafer surface can be scanned by a linear beam spot.

More specifically, the scanning mechanism 58 is formed of a ball screw 60 extending along the direction in which the collimated light travels, and a guide rail 52 extending parallel to the screw 60. The second parabolic reflection mirror 54 is attached to the guide rail 62 via a slide block 64, and is movable along the guide rail 62. The slide block 64 is coupled to a movable member 66 on the ball screw 60. The ball screw 60 is rotated by a scanning motor 68.

Hence, upon rotating the scanning motor 68 in the forward/reverse direction, the ball screw 60 rotates to reciprocally move the second parabolic reflection mirror 54 coupled to the movable member 66. In this embodiment, the work table 8 is rotatable but is fixed in position in the horizontal direction. For this reason, the diameter of the transparent window 36 is nearly equal to or larger than the diameter of the wafer W, and the diameter of the process chamber 4 can be smaller than that of the apparatus shown in FIG. 1.

In the apparatus shown in FIG. 7, light 56 emitted by the light source 38 is reflected by the first parabolic reflection mirror 52 to be converted into collimated light, and the collimated light travels in the horizontal direction. This collimated light is reflected downward by the second parabolic reflection mirror 54, and is focused onto the wafer surface as the second focal point F4 as a linear beam spot with high energy density. Since the second parabolic reflection mirror 54 reciprocally moves above the transparent window 36 horizontally by the scanning mechanism 58 at a predetermined speed, the wafer surface can be scanned by the linear light spot formed by light reflected by the mirror 54.

With this arrangement, the apparatus shown in FIG. 7 can rapidly heat/cool the wafer surface alone with high energy density and can attain predetermined heat treatment as in the apparatus shown in FIG. 1. Since neither the entire wafer nor the work table itself need be heated/cooled, the throughput can be improved accordingly, and energy savings can be attained.

Especially, in this embodiment, the linear beam spot is scanned by reciprocally moving the second parabolic reflection mirror 54 set outside the chamber without moving the work table 8. Hence, a simple scanning mechanism can be used, and the process chamber 4 can have a small diameter.

Figure 8:
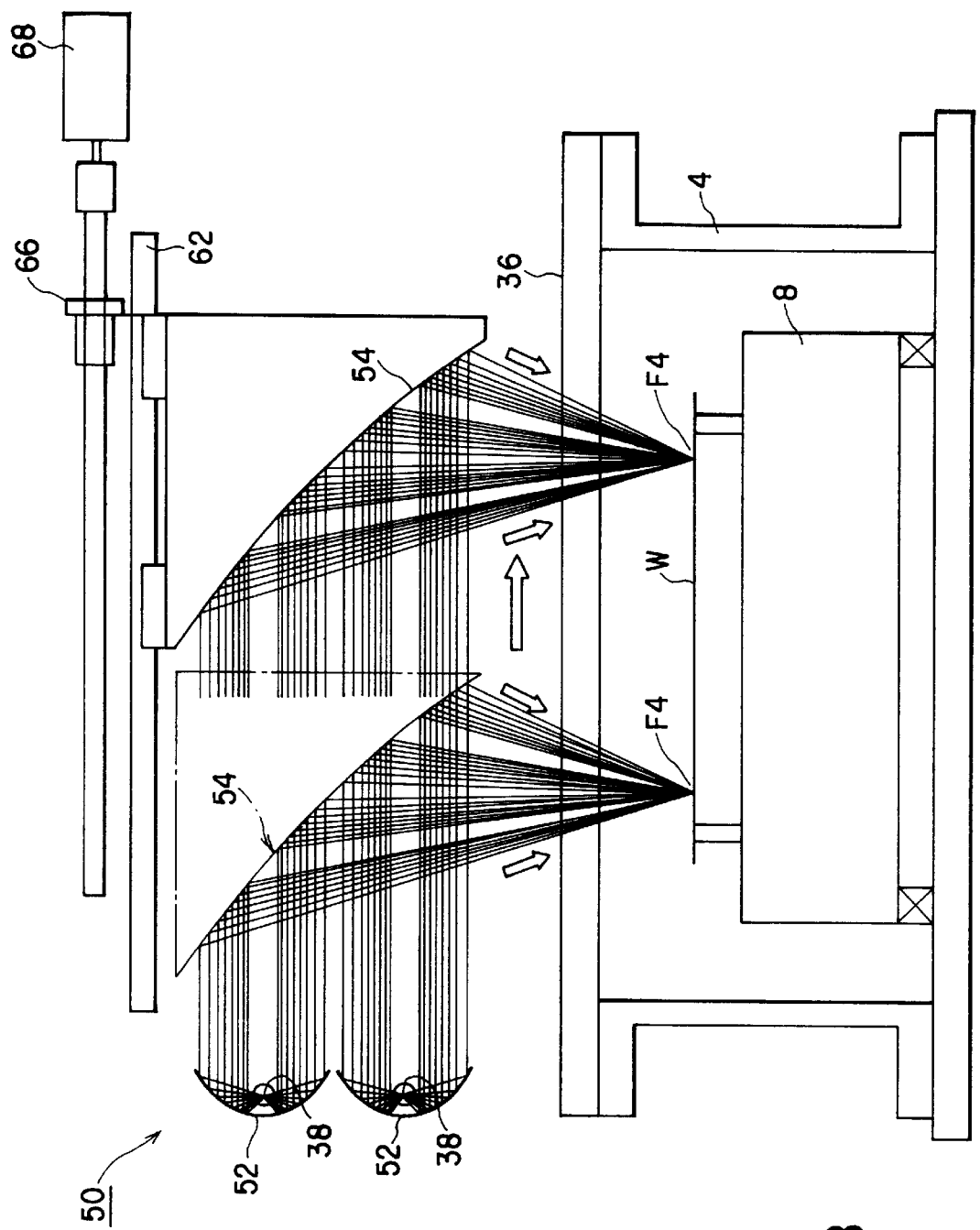
FIG. 8 is a view showing a modification of the apparatus shown in FIG. 7.

FIG. 8 shows a modification of the apparatus shown in FIG. 7. In this modification, a plurality of pairs (two pairs in this case) of first parabolic reflection mirrors 52 and light sources 38 are vertically juxtaposed. Light coming from each light source 38 is reflected by the second parabolic reflection mirror 54, and is brought to a focus onto a single second focal point F4.

Figure 9:
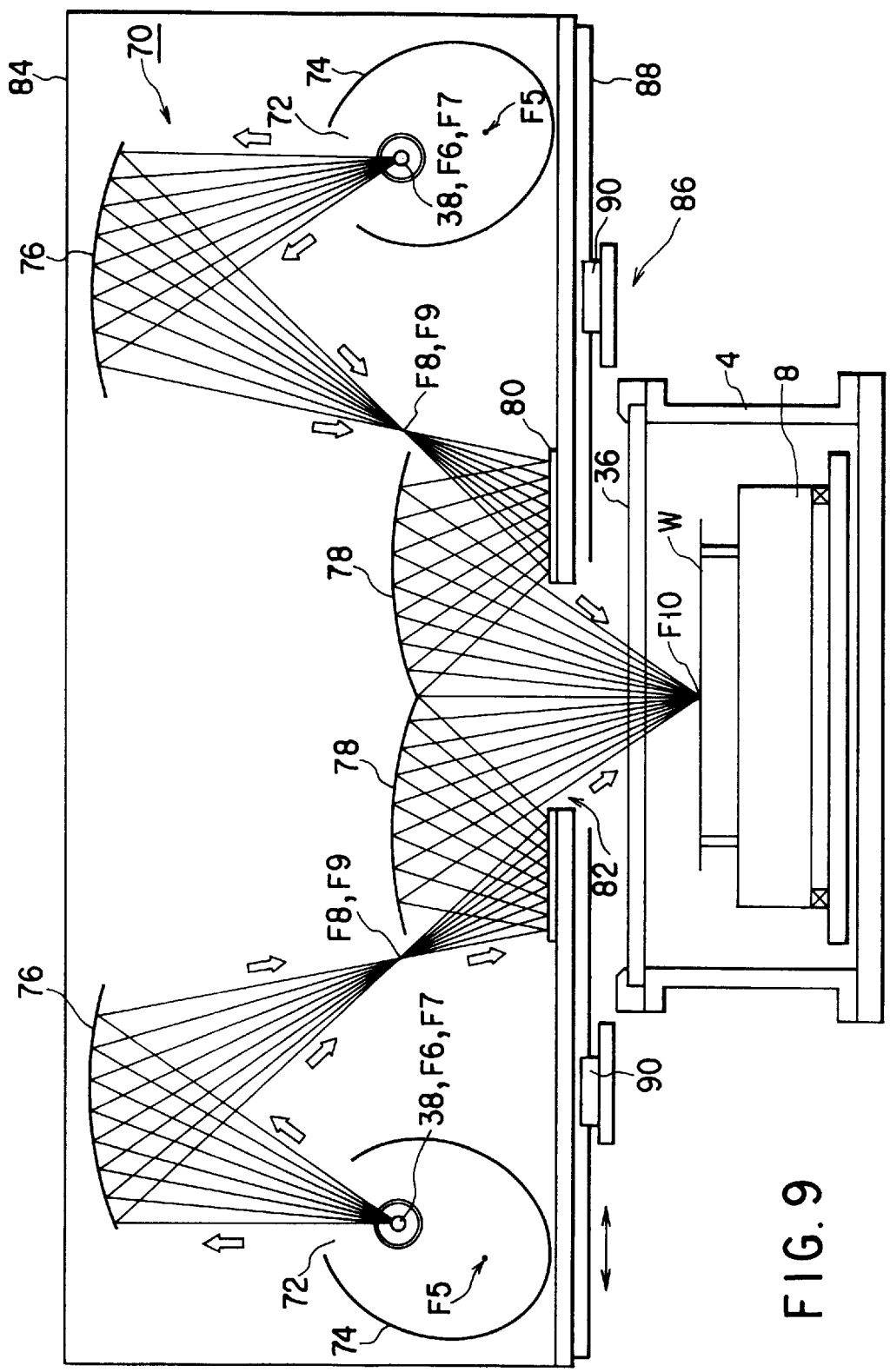
FIG. 9 is a view showing a single-substrate-heat-treatment apparatus according to still another embodiment of the present invention.

FIG. 9 shows a single-substrate-heat-treatment apparatus according to still another embodiment of the present invention.

As shown in FIG. 9, a discharge lamp (e.g., a xenon lamp, metal halide lamp, or the like) for emitting light by arc discharge by arranging electrodes at the two ends of a glass tube is used as a light source. In this embodiment, two pairs of light sources 38 and reflection mirror mechanisms 70 are symmetrically set at the right and left positions in FIG. 9 to realize a linear beam spot with higher energy density.

Each reflection mirror mechanism 70 is mainly formed of an elliptic reflection mirror 74 having an elliptic section along the optical axis direction, which has a relatively small radiation opening 72 at its distal end, and roughly covers first and second focal points F5 and F6, a pair of dual elliptic reflection mirrors 76 and 78 each having an elliptic section along the optical axis direction to focus light coming from the reflection mirror 74.

The elliptic reflection mirror 74 has a length equal to or slightly larger than the diameter of the wafer W, as shown in FIG. 11, and can cover the entire diameter of the wafer. Also, the dual elliptic reflection mirrors 76 and 78 are similarly formed to have a large length. The elliptic reflection mirror 74 has a nearly complete elliptic section except for the radiation opening 72 with a small size unlike the semi-elliptic reflection mirror 46 shown in FIG. 1, and covers not only the first focal point F5 but also the second focal point F6.

The emission line 44 of the light source 38 is located on the second focal point F6 closer to the radiation opening 72.

One dual elliptic reflection mirror 76 of the pair of dual elliptic reflection mirrors is set in the radiation direction of the elliptic reflection mirror 74. One focal point F7 of the reflection mirror 76 agrees with the second focal point F6 of the elliptic reflection mirror 74.

The other dual elliptic reflection mirrors 78 is set so that the other focal point F8 of the one dual elliptic reflection mirror 76 agrees with one focal point F9 of the other dual elliptic reflection mirror 78. In this embodiment, a plane direction-conversion mirror 80 is inserted in the middle of the optical path between the focal point F9 and the dual elliptic reflection mirror 78, and the other dual elliptic reflection mirror 78 is set facing down.

The other focal point F10 of the other dual elliptic reflection mirror 78 is set on the surface of the wafer W. In FIG. 9, light beams coming from the light sources 38 set at the two ends are brought to a focus at one point on the focal point F10 on the wafer surface.

These light sources 38 and reflection mirror mechanisms 70 are stored in a casing 84 having a light passage opening 82 at, e.g., its bottom portion. A scanning mechanism 86 is disposed under the casing 84. More specifically, a pair of slide rails 88 are disposed on the two sides of the lower surface of the casing 84, and are slidably attached to stationary blocks 90 on the stationary side. The casing 84 itself is slidable by a scanning motor 92 and a ball screw 94 rotated by the motor 92, as shown in FIG. 10.

Figure 10:
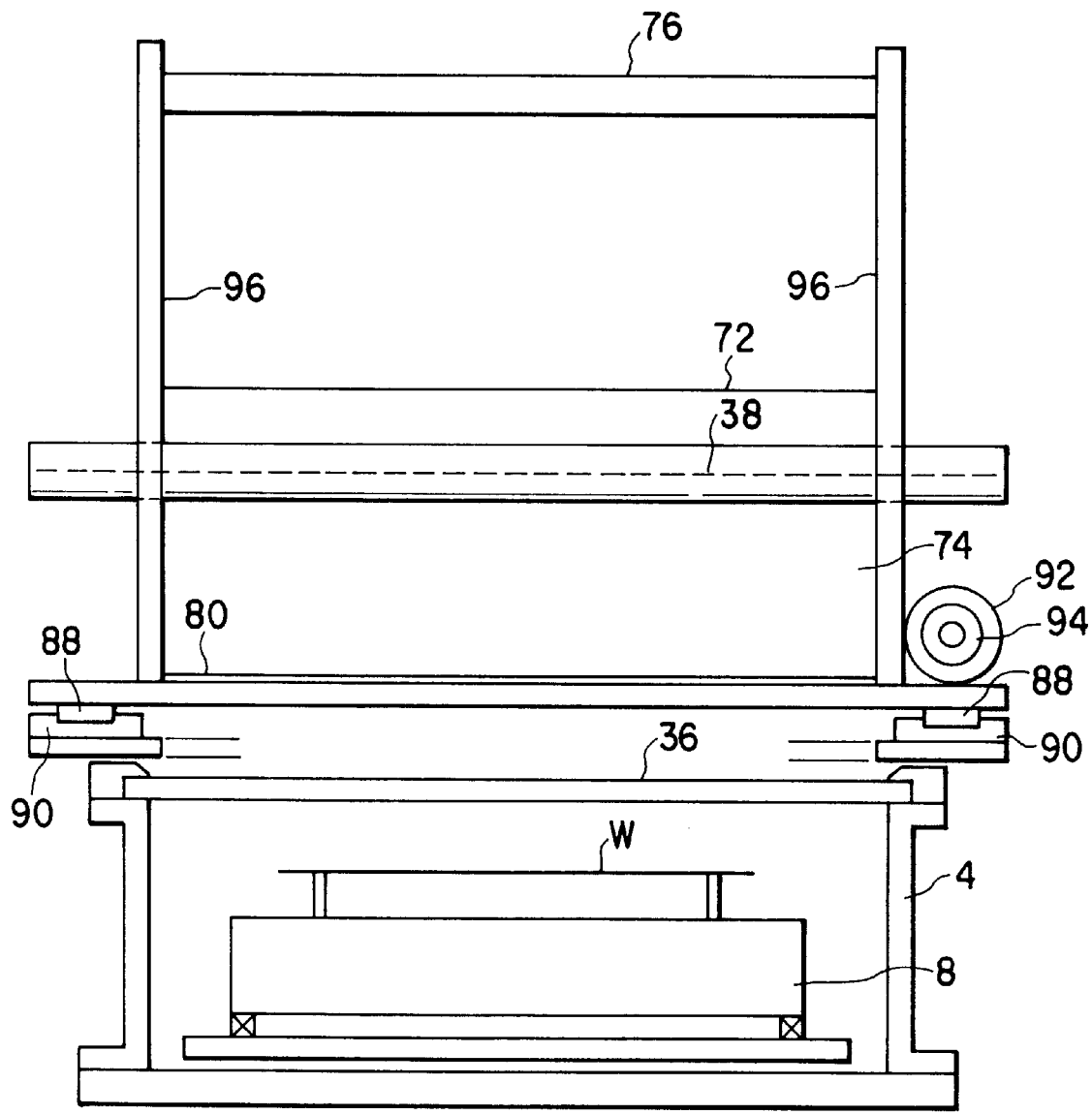
FIG. 10 is a side view of the apparatus shown in FIG. 9.

Also, as shown in FIG. 10, plane anti-scattering mirrors 96 are disposed on the two sides of the light sources 38 to form the side plates of the casing 84. The mirrors 96 reflect light that leak toward the side portions inwardly so as to apparently form light sources with an infinite length.

In the apparatus shown in FIG. 9, light emitted by each light source 38 is reflected by the elliptic reflection mirror 74 set to surround the light source 38, and travels toward one dual elliptic reflection mirror 76 via the radiation opening 72. The light reflected by the reflection mirror 76 is focused to the common focal point F8 (F9), and the light passing through the focal point F8 is then reflected by the direction-conversion mirror 80. Then, the reflected light travels toward the other dual elliptic reflection mirror 78. The light reflected by the reflection mirror 78 is focused to the focal point F10 located on the surface of the semiconductor wafer W.

Note that the wafer surface is scanned by a linear beam spot by driving the scanning mechanism 86.

A very advantageous effect of the elliptic reflection mirror 74 with the small-diameter radiation opening 72 and the dual elliptic reflection mirrors 76 and 78 upon forming light with high energy will be explained below.

First, the operation of the elliptic reflection mirror 74 will be described below with reference to FIGS. 12A and 12B.

All the light components emitted by the emission line 44 of the light source 38 on the second focal point F6 in all the directions in FIG. 9 are radiated via the radiation opening 72 to have a given divergence angle. More specifically, light components emitted by the emission line 44 toward the radiation opening 72 leave the reflection mirror 74 without being reflected by the mirror 74. On the other hand, other light components are reflected a plurality of number of times by the elliptic reflection mirror 74, are deflected in the radiation direction, and then finally leave the radiation opening 72.

FIG. 12A shows a state wherein emitted light 98 is reflected twice by the reflection mirror 74, and finally leaves the radiation opening 72 via the first focal point F5. FIG. 12B shows a state wherein emitted light 98 is reflected four times by the reflection mirror 74, and finally leaves the radiation opening 72 via the first and second focal points F5 and F6.

Note that two or more light rays can be overlapped on an identical path. More specifically, in FIG. 12A, light rays emitted by the emission line 44 in directions A and B are finally deflected in the direction A, and are output to overlap each other. In FIG. 12B, light rays emitted by the emission line 44 in directions C, D, and E are finally deflected in the direction C and are output to overlap each other.

To understand more clearly, assume that the reflection mirror 74 and light source form a single light source device. That is, in this light source device, all light components emitted by the light source in all the directions are radiated from the radiation opening 72 of the reflection mirror 74 as light rays with angles that can become incident on the elliptic mirror 76. In a normal optical system shown in FIG. 1, only nearly half of the light rays originating from the light source can become incident on the reflection mirror. On the other hand, in the optical system shown in FIG. 9, all light rays originating from the light source are condensed. According to the optical apparatus shown in FIG. 9, light rays can be made to overlap each other within the range in which light rays or an arc discharge and light rays do not influence each other, and the energy density of the light can be increased.

Unlike the apparatuses shown in FIGS. 1 and 7, the apparatus shown in FIG. 9 can output and use light rays emitted in nearly all the directions within a given divergence angle or less, thus also improving the use efficiency of light.

Figure 14:
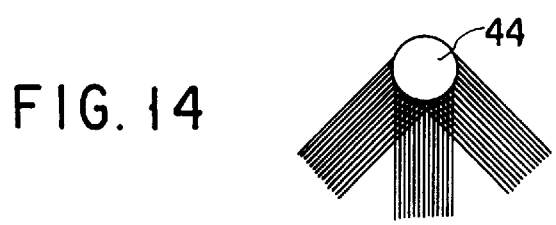
FIG. 14 is an enlarged view of light emitted from an emission line on one of the focal points of the dual elliptic reflection mirrors.
Figure 15:
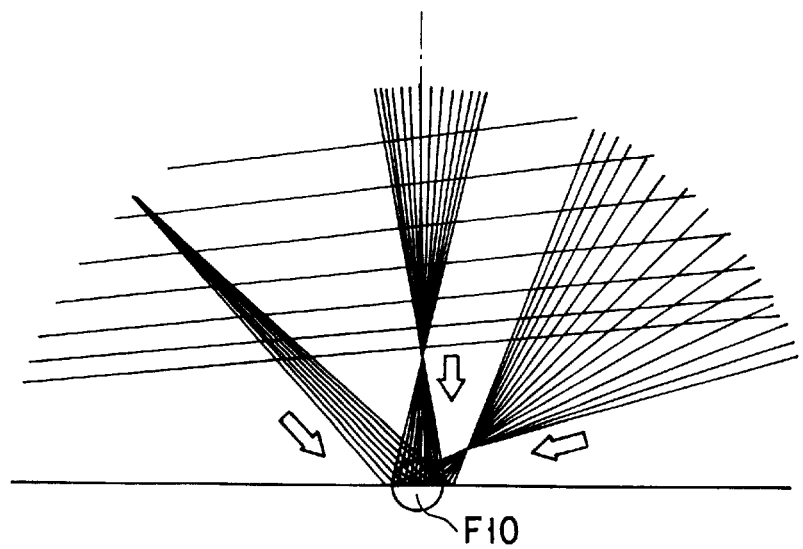
FIG. 15 is an enlarged view showing a converging portion on the other one of the focal points of the dual elliptic reflection mirrors.

The operation of the dual elliptic reflection mirrors 76 and 78 will be explained below with reference to FIGS. 13 to 15.

Figure 13:
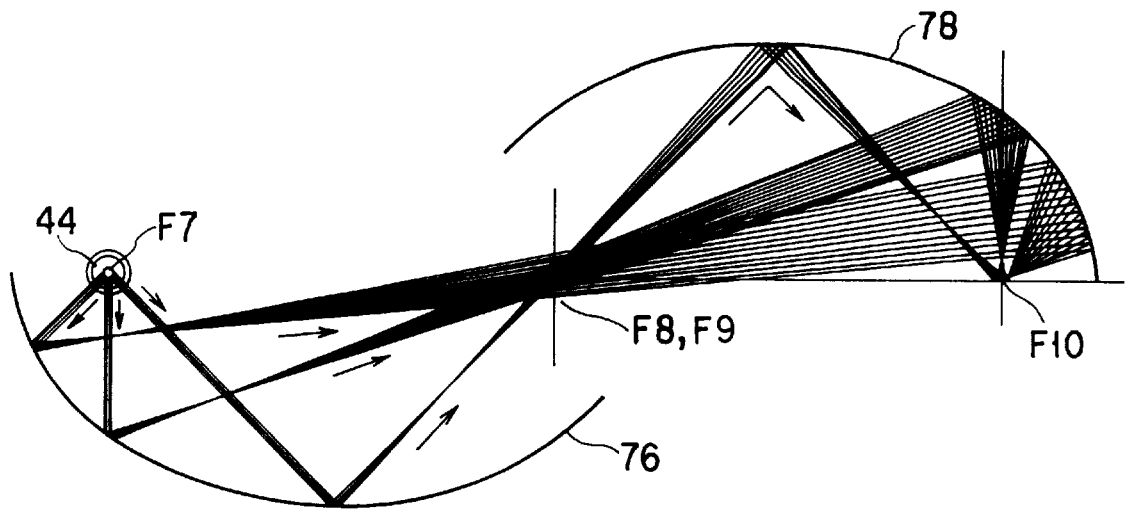
FIG. 13 is a view showing the overall optical paths of dual elliptic reflection mirrors.

FIG. 13 shows the overall optical paths of the dual elliptic reflection mirrors. The direction-conversion mirror 80 in FIG. 9 bends the optical paths of light rays in FIG. 13 to set the elliptic mirrors 76 and 78 at positions opposing the wafer W, and is not shown in FIG. 13 for the sake of simplicity. FIG. 13 shows the ray tracing results of light rays in −45°, −90°, and −145° directions toward the focal point F10 under the assumption that the sectional diameter of the emission line 4 on the focal point F7 is 2 mm. Light rays are radiated from all the points on the perimeter of a light source having a finite size in all the directions. However, since light rays of specific angles are extracted and illustrated, they seem like light beams having a width equal to the diameter of the light source, as shown in FIG. 14.

Light emitted by the light source is reflected by the elliptic mirror 76, and its spread increases temporarily. However, the light is reflected by the elliptic reflection mirror 78, and its width falls within the range of the original diameter of the light source when the light has reached the focal point F10, as shown in FIG. 15. This is because any errors produced cancel each other since the light is reflected twice by the mirrors having a similar shape. As can be seen from a comparison with the case shown in FIG. 6, a spread of light at the focal point is very small in this embodiment, i.e., can be minimized.

Hence, a linear beam spot with very high energy density can be obtained by the operations of the dual elliptic reflection mirrors 76 and 78, and the aforementioned elliptic reflection mirror 74. As a consequence, since the wafer surface alone can be rapidly heated/cooled, the throughput can be further improved. Furthermore, since the wafer surface can be set at high temperature, heat treatment at higher temperature, e.g., approximately 1,400° C., may be done.

Note that another light source 38 can be set on the first focal point F5 of the elliptic reflection mirror 74. Light coming from this light source is added to light originating from the second focal point F7, thus realizing a linear beam spot with still higher energy density. However, in this case, a lamp having a structure with a filament such as a halogen lamp cannot be used as the light source since it intercepts light reflected by the elliptic reflection mirror 74. More specifically, only a discharge lamp (e.g., a xenon lamp, metal halide lamp, or the like), the emission line 44 of which has a small sectional diameter, can be used as the light source 38. Since the light sources are small, light rays can be made to overlap each other, and a spread of light at the focal point can be minimized by the optical system using dual elliptic mirrors, a linear beam spot with higher energy density can be realized.

Figure 16:
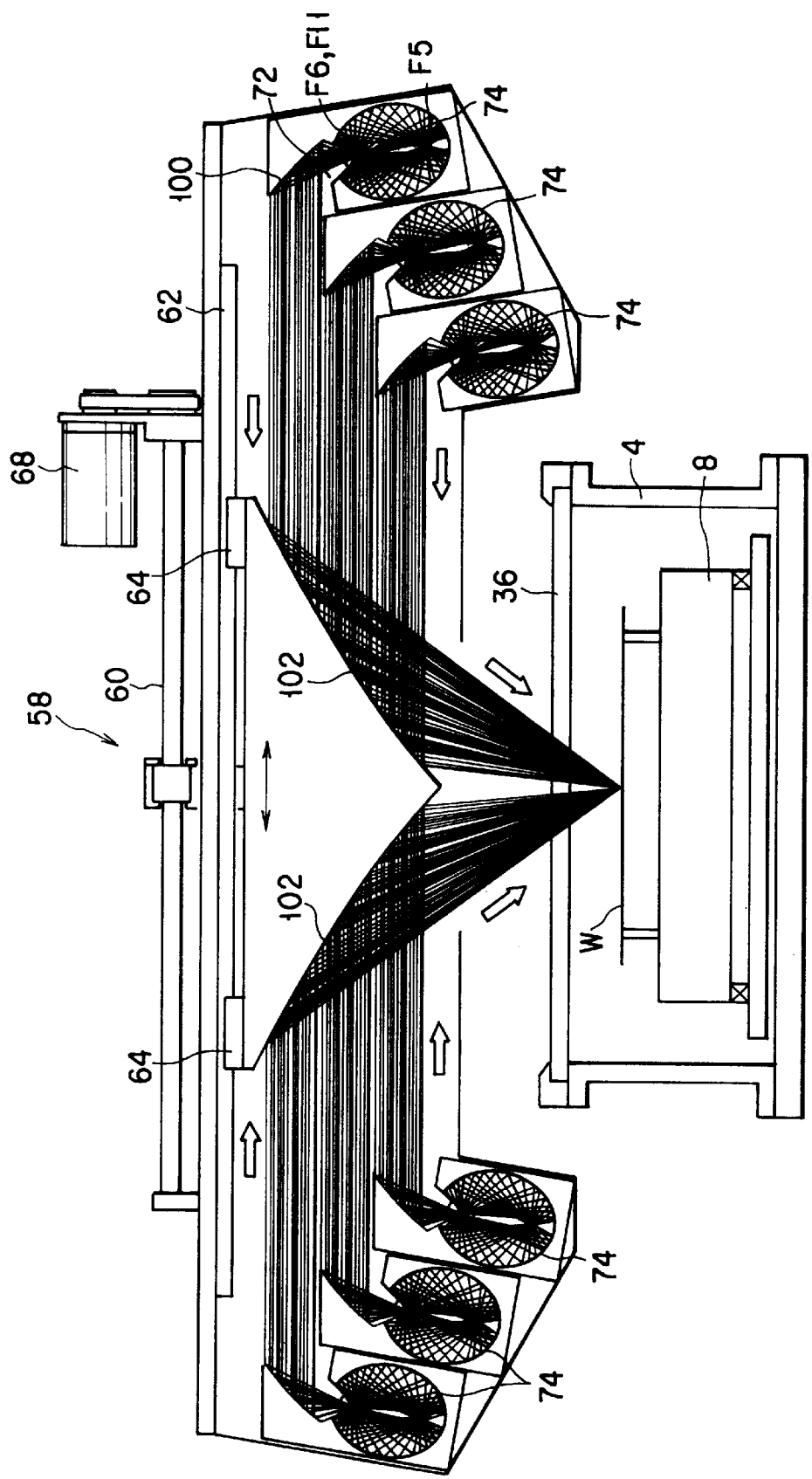
FIG. 16 is a view showing a single-substrate-heat-treatment apparatus according to still another embodiment of the present invention.

FIG. 16 shows a single-substrate-heat-treatment apparatus according to still another embodiment of the present invention.

This embodiment uses a combination of a pair of parabolic reflection mirrors shown in FIG. 7, and light source devices having light sources 38 and elliptic mirrors 74 shown in FIG. 9.

First parabolic reflection mirrors 100 each of which sets its focal point F11 at the same position as the second focal point F6 of the corresponding elliptic reflection mirror 74 and has a parabolic section are placed in front of the radiation openings 72 of the elliptic reflection mirrors 74 in six light source devices. Light coming from each elliptic mirror 74 is reflected by the first parabolic reflection mirror 100 in the horizontal direction, and is converted into collimated light.

Second parabolic reflection mirrors 102 each having a parabolic section are placed above the transparent window 36. A focal point F12 of each reflection mirror 102 is set to be located on the surface of the wafer W.

In this case, since collimated light beams come from the right and left sides in FIG. 16 toward the center, the reflection mirrors 102 are joined so as to direct their reflecting directions toward each other and to bring light beams to a focus on the common focal point F12.

The second parabolic reflection mirrors 102 are horizontally movable by a scanning mechanism 58 similar to that shown in FIG. 7. More specifically, the scanning mechanism 58 has a ball screw 60 rotated by a scanning motor 68, a guide rail 62, and slide blocks 64 which are slidably supported by the guide rail 62 while holding the second parabolic reflection mirrors 102. Also, plane anti-scattering mirrors (having a function similar to that of the mirrors 96 in FIG. 10) are set aside the first parabolic reflection mirrors 100 so as to prevent lateral light leakage.

In the apparatus shown in FIG. 16, light emitted by each light source 38 is reflected by the elliptic reflection mirror 74, and leaves the emission opening 72. The light is then reflected by the first parabolic reflection mirror 100 and is converted into collimated light. The collimated light travels in the horizontal direction. This collimated light is reflected downward by the second parabolic reflection mirror 102, which is scanned in the horizontal direction, and is focused to the focal point F12 on the wafer surface. Since light beams coming from the six light sources 38 are focused to the common focal point F12, a linear beam spot with very high energy density can be realized.

Therefore, the wafer surface alone can be heated more rapidly, and predetermined heat treatment can be done. In this manner, since heating/cooling can be rapidly attained, the throughput can be further improved, and energy savings can be attained.

In this embodiment, the second parabolic reflection mirrors 102 are moved without moving the light sources 38 as in the apparatus shown in FIG. 7, thus scanning the wafer surface with the linear beam spot. For this reason, the movable member is light in weight, a simple scanning mechanism 58 can be used, and no problems arising from movement of the light sources 38 are posed.

Figure 17:
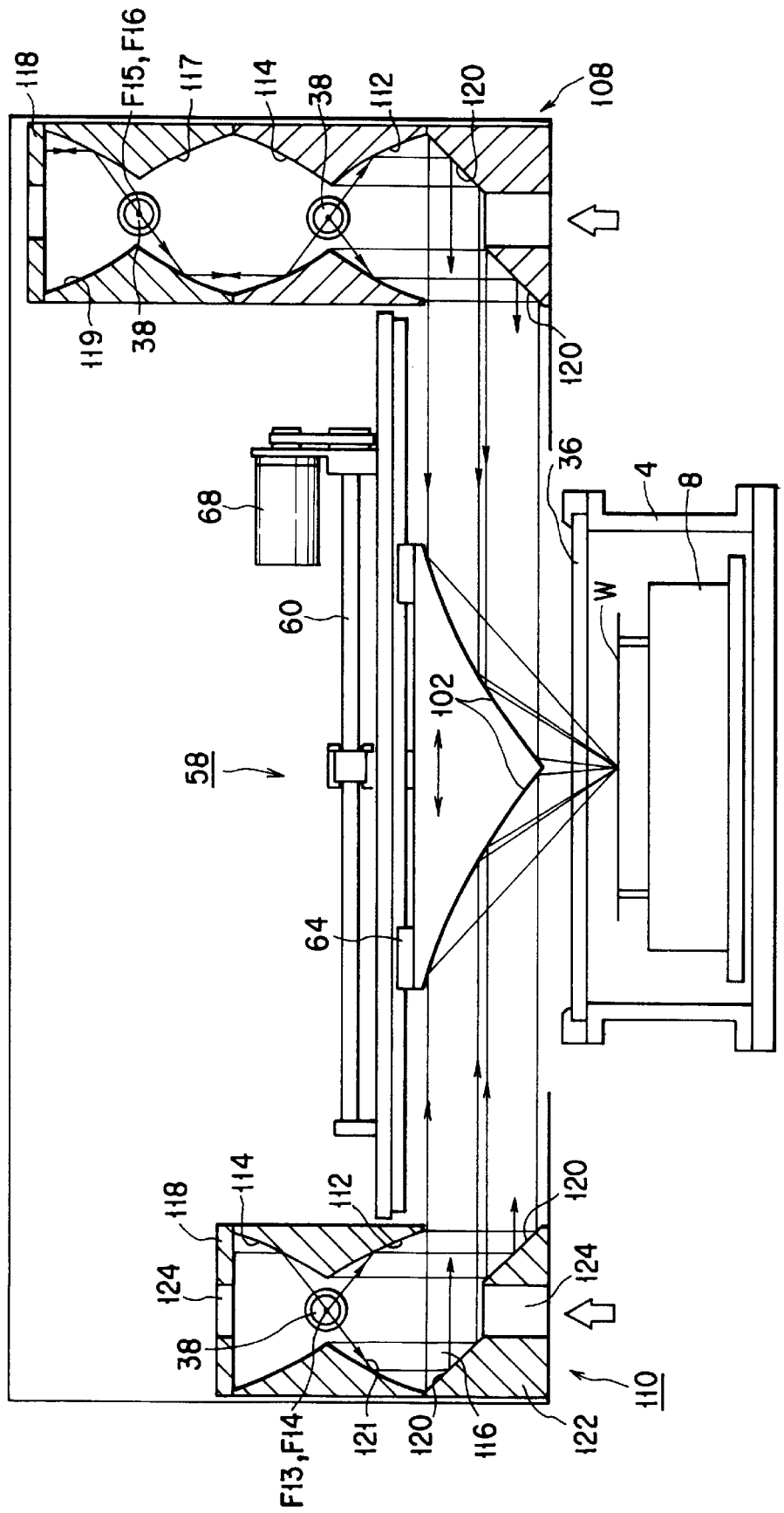
FIG. 17 is a view showing a single-substrate-heat-treatment apparatus according to still another embodiment of the present invention.

FIG. 17 shows a single-substrate-heat-treatment apparatus according to still another embodiment of the present invention.

In this embodiment, the arrangements of the second parabolic reflection mirrors 102 and scanning mechanism 58 are the same as those in the apparatus shown in FIG. 16. The difference from the apparatus shown in FIG. 16 is that multi-stage parabolic reflection mirrors 108 and 110 each of which is formed by connecting reflection mirrors with a parabolic section along the optical axis direction in multiple stages so as to form collimated light are used as light source devices. In FIG. 17, two parabolic reflection mirrors are connected on the left side, and four parabolic reflection mirrors are connected on the right side. In practice, right and left light source devices with an identical structure are used, but those with different structures are used in this case for the sake of description.

In the left multi-stage parabolic reflection mirror 110, two parabolic reflection mirrors 112 and 114 each having a parabolic section are inverted and joined in opposite directions. In this case, the two reflection mirrors 112 and 114 are connected in series with each other so that the position of a focal point F13 of one, i.e., front reflection mirror 112 agrees with that of a focal point F14 of the other, i.e., rear reflection mirror 114. The light source 38 is set on the focal point F13 (F14). One end of the front reflection mirror 112 is open to form a radiation opening 116, and outputs light therefrom.

A rear plane reflection mirror 118 having a planar shape extending in a direction perpendicular to the radiation direction is disposed behind the rear reflection mirror 114. The position of the reflection mirror 118 is not particularly limited.

A plane direction-conversion mirror 120 which is inclined nearly 45° is set in front of (below in FIG. 17) the radiation opening 116, and changes the direction that the collimated light output downward travels through 90° to make that light travel in the horizontal direction. The light source 38 is set on the focal point F13 (F14). The multi-stage parabolic reflection mirror 110 can be easily formed as follows. For example, an aluminum block body 122 is divided into some block bodies, and these block bodies are partially hollowed out. The inner surfaces of these blocks are gold-plated or mercury layers are formed by, e.g., deposition on the inner surfaces, and after that, the divided blocks are reassembled. Cooling openings 124 are formed on the upper and lower portions of the block body 122, and cooling air is supplied from these openings to cool the interior of the block.

On the other hand, in the right multi-stage parabolic reflection mirror 108, a pair of parabolic reflection mirrors 117 and 119, which have a parabolic section and are connected in series with each other in opposite directions, are connected in series with the structure of the left multi-stage parabolic reflection mirror 110. The second light source 38 is set at a common focal point F15 (F16) of the two mirrors 117 and 119. Other arrangements are the same as those in the left multi-stage parabolic reflection mirror 110.

In the apparatus shown in FIG. 17, of light 121 emitted by each light source 38, light emitted forward (downward) is reflected by the parabolic reflection mirror 112 or the mirrors 117, 114, and 112 located in front of (below) the light source 38, and is converted into collimated light. The collimated light is deflected 90° by the direction-conversion mirror 120, and is output toward the second parabolic mirror 102 side as collimated light.

Light emitted backward (upward) by the light source 38 is reflected by the reflection mirror 114 or the mirrors 114, 117, and 119 located behind the light source 38, and is then reflected forward (downward) by the plane reflection mirror 119. After the light is reflected by all the reflection mirrors, the light is deflected 90° by the direction-conversion mirror 120, and is output toward the second parabolic mirror 102 side as collimated light as in the above-mentioned case. As a consequence, since light rays are made to overlap each other on an identical path, light rays having very high energy density can be obtained.

In case of the right multi-stage reflection mirror 108, light rays emitted forward (downward) and backward (upward) by the lower light source 38, and light rays emitted forward (downward) and backward (upward) by the upper light source 38 trace the same paths, become incident on the parabolic reflection mirror 102 as collimated light, and finally form a linear spot on the wafer surface. In the apparatus shown in FIG. 17, light rays originating from a plurality of light sources are made to overlap each other on an identical path, thus realizing higher-grade overlapping.

Hence, in this embodiment as well, a linear spot with very high energy density can be formed on the wafer surface, and the temperature of the wafer surface alone can be rapidly raised to quickly attain desired heat treatment. More specifically, the throughput can be greatly improved, and energy savings can also be attained.

Figure 18:
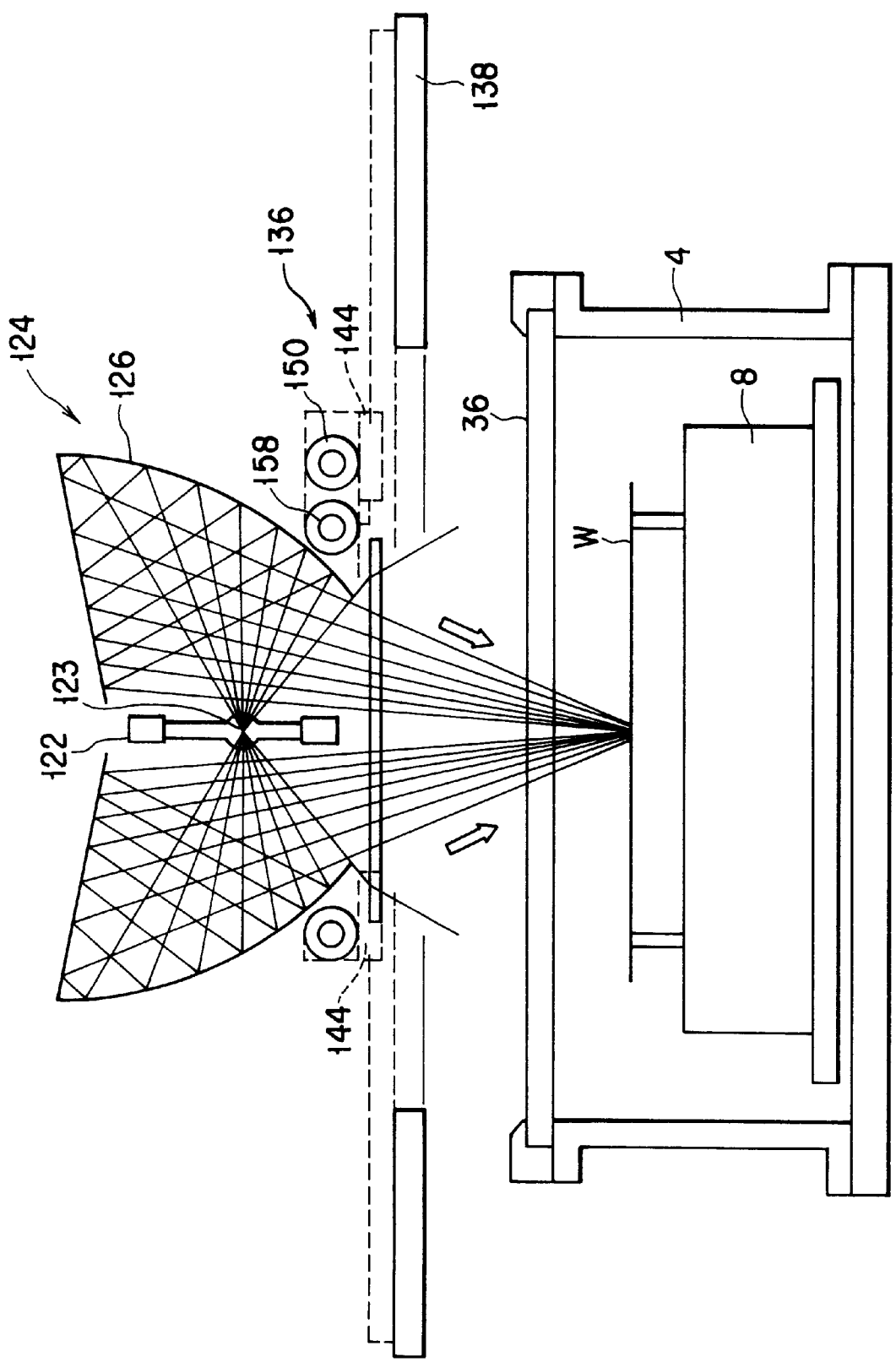
FIG. 18 is a view showing a single-substrate-heat-treatment apparatus according to still another embodiment of the present invention.

FIG. 18 shows a single-substrate-heat-treatment apparatus according to still another embodiment of the present invention.

In the embodiments illustrated in FIGS. 1 to 17, a lamp which mainly generates a relatively elongated linear emission line using arc discharge or a filament is used as a light source. However, the present invention is not limited to such specific light source, and may be applied to a case using a lamp which generates an emission point as a light source. When a lamp which generates an emission point, i.e., a point light source is used as a light source, a two-dimensional scanning mechanism which can scan the wafer surface all over with the obtained spot, i.e., a scanning mechanism such as an X-Y stage, and the like, is used.

As shown in FIG. 18, a halogen lamp or xenon lamp that generates an emission point 123 is used as a light source 122. A reflection mirror mechanism 124 that condenses light emitted by the light source 122 is formed of an elliptic reflection mirror 126 having an elliptic section along the optical axis direction, and a linear reflection mirror 128 having a linear section along the optical axis direction to focus light coming from the mirror 126. With this arrangement, many light components can be brought to a focus at one point on a focal point by controlling the divergence angle of reflected light, as will be described later.

More specifically, the reflection mirror mechanism 124 uses the same reflection mirror mechanism disclosed in co-pending U.S. patent application Ser. No. 09/079,290 filed on May 15, 1998 by the present inventor, the teachings of which are hereby incorporated by reference.

Figure 20:
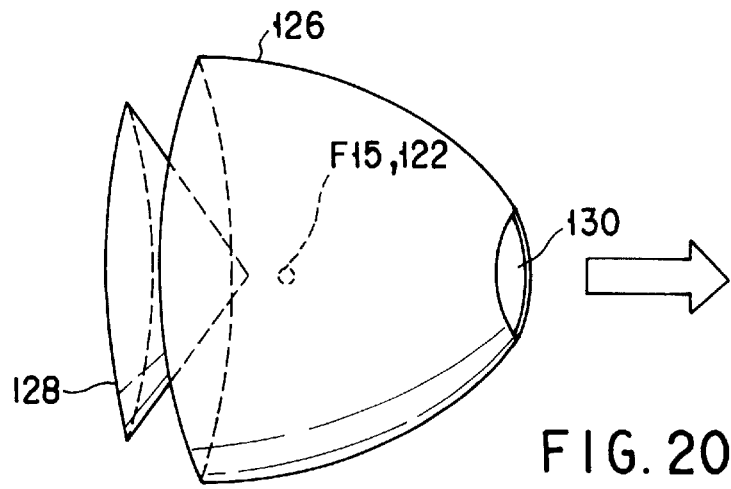
FIG. 20 is a schematic perspective view showing a light source and a reflection mirror mechanism in the apparatus shown in FIG. 18.
Figure 21:
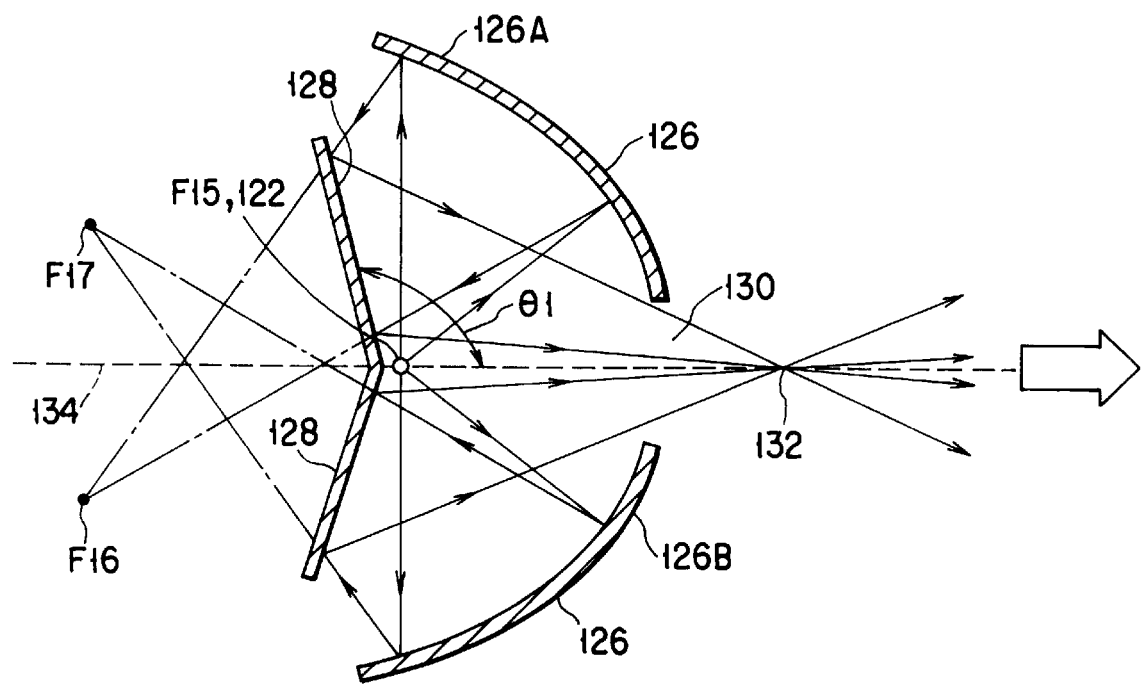
FIG. 21 is an explanatory view showing the relationship between the light source and reflection mirror mechanism in the apparatus shown in FIG. 18.

More specifically, as shown in FIGS. 20 and 21, the elliptic reflection mirror 126 is formed into, e.g., a dome shape so that its section in the light radiation direction defines a portion of an elliptic shape, and a circular radiation opening 130 having a relatively small diameter is open to its distal end.

By contrast, the linear reflection mirror 128 is formed into an umbrella shape so that its section in the light radiation direction has a linear shape bent at the center, and the entire reflection surface forms a portion of a circular cone of revolution. The light source 122 is set on a focal point F15 of the elliptic shape of the elliptic reflection mirror 126. Hence, after light emitted by the light source 122 is reflected by the elliptic reflection mirror 126, the light travels toward the linear reflection mirror 128 behind the light source 122, and is reflected by the mirror 128. After that, the light travels forward, is output from the radiation opening 130, and is focused to a converging point 132.

In this case, it should be noted that the upper and lower portions of ellipses in FIG. 21, i.e., an upper elliptic arc 126A and lower elliptic arc 126B do not form portions of a continuous single ellipse. More specifically, one focal point of an ellipse that forms the upper elliptic arc 126A is located at the point F15, which is the same point as one focal point of the lower elliptic arc 126B, but the other focal point F16 is located below a central line 134. On the other hand, one focal point of an ellipse that forms the lower elliptic arc 126B is located at the point F15, but the other focal point F17 is located above the central line 134 at a position symmetrical to the focal point F16 about the central line 134.

A tilt angle θ1 the linear reflection mirror 128 makes with the central line 134 is set so that virtual images of the focal points F16 and F17 are located at an identical point, i.e., the converging point 132 if the corresponding straight lines of the section of the linear reflection mirror 128 are defined as symmetry axes. In FIG. 21, one section that passes through the central line 134 has been explained. Also, the above-mentioned relation holds for all the sections which are taken along the central line 134 from arbitrary directions.

Figure 19:
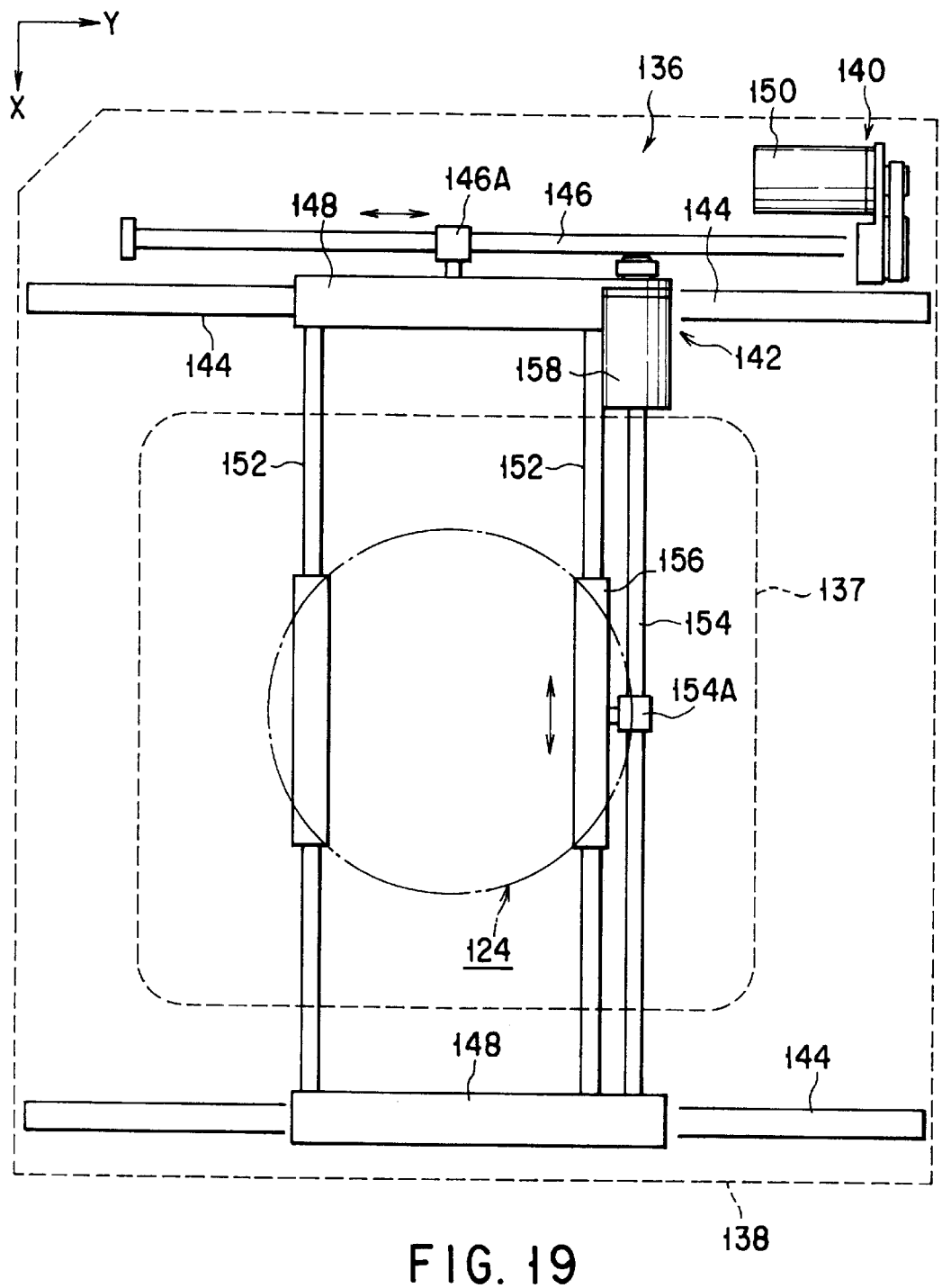
FIG. 19 is a top view of the apparatus shown in FIG. 18.

FIG. 19 shows a scanning mechanism 136 for integrally scanning the light source 122 and reflection mirror mechanism 124. The scanning mechanism 136 is placed on a stationary base 138 having a large central opening 137. More specifically, the scanning mechanism 136 is constructed by Y- and X-scanning mechanisms 140 and 142.

The Y-scanning mechanism 140 is formed of two parallel Y-guides 144 which are disposed on the stationary base 138 in the Y-direction, a Y-ball screw 146 arranged parallel to the Y-guides 144, and Y-slide members 148 slidably attached to the Y-guides 144. A movable member 146A of the Y-ball screw 146 is coupled to one Y-slide member 148. By rotating a Y-motor 150 of the Y-ball screw 146 in the forward/reverse direction, the Y-slide members 148 slidably move in the Y-direction along the Y-guides 144.

The X-scanning mechanism 142 is formed of two X-guides 152 bridged between the two Y-slide members 148, an X-ball screw 154 arranged parallel to these slide members, and X-slide members 156 slidably attached to the X-guides 152. A movable member 154A of the X-ball screw 154 is coupled to one X-movable member 156. By rotating an X-motor 158 of the X-ball screw 154 in the forward/reverse direction, the X-slide members 156 slidably move in the X-direction along the X-guides 152.

The light source 122 and reflection mirror mechanism 124 are integrally attached and fixed to the X-slide members 156. Hence, the light source 122 and reflection mirror mechanism 124 can be moved in the horizontal plane, i.e., in the X- and Y-directions.

In the apparatus shown in FIG. 18, light emitted by the light source 122 is reflected by the elliptic reflection mirror 126 placed in front of the light source, and then travels toward the rear linear reflection mirror 126. The light reflected forward by the linear reflection mirror 126 is focused to the converging point 132 via the radiation opening 130. The converging point 132 is set on the surface of the wafer W to heat it.

As can be seen from FIG. 21, light rays emitted by the light source 122 over a broad angular range are focused to the converging point 132. Especially, light rays that travel forward from the light source 122, except for those traveling toward the radiation opening 130 can be effectively focused and used, thus improving the use efficiency of emitted light. Note that light that travels backward from the light source 122 is not shown. Normally, since the rear surface side of the light source is in the shade of the light source itself, and light in this portion suffers large converging errors, it cannot be used.

By appropriately driving the X- and Y-scanning mechanisms 142 and 140 in FIG. 19, the light source 122 and reflection mirror mechanism 124 can be integrally scanned in the X- and Y-directions. Hence, the entire surface of the wafer W can be scanned.

To restate, in this embodiment as well, a point-like beam spot with very high energy density can be formed on the wafer surface by effectively using emitted light. In addition, since scanning is performed with this spot moved in the X- and Y-directions, the temperature of the wafer surface alone can be rapidly raised to quickly achieve desired heat treatment. Since only the wafer surface is heated but the entire wafer is not heated, cooling can also be done quickly. Hence, the throughput can be greatly improved, and energy savings can be achieved.

In the embodiment shown in FIGS. 18 to 21, light rays emitted by a light source that forms an emission point are focused to a single point. Alternatively, a short, linear spot may be formed at the focal point. In this case, the linear spot can be two-dimensionally scanned more easily than the point-like spot.

The reflection mirror mechanisms described in the embodiments shown in FIGS. 1 to 21 are merely examples. The arrangement of the reflection mirror mechanism is not particularly limited as long as it can form a spot with high energy density. As heat treatment, annealing, film formation, oxidation, diffusion, and the like may be done. Furthermore, the target substrate is not limited to a semiconductor wafer, but the present invention may be applied to a glass substrate, LCD substrate, and the like.

The second aspect of the present invention will be explained hereinafter. The second aspect of the present invention relates to a single-substrate-heat-treatment apparatus which controls the temperature of the target substrate by selectively and locally heating the target substrate on the basis of the temperature distribution measured by a scanning radiation temperature measurement mechanism. Upon achieving the present invention, the present inventor has found the facts to be described below as a result of comparison tests between a single-substrate-heat-treatment apparatus of this type to which the present invention is applied, and a conventional single-substrate-heat-treatment apparatus which controls the temperature of the target substrate using combinations of thermocouples and heating heaters or lamps, which are roughly classified into some zones.

The target substrate, e.g., a semiconductor wafer undergoes heat treatment while being supported by some method. Normally, the supported portion of the wafer has a lower temperature than its surrounding portion since heat dissipates via the support member. The temperature nonuniformity formed in this way cannot be coped with by the conventional apparatus, i.e., combinations of thermocouples and heating heaters or lamps, which are roughly classified into some zones. Upon detecting the temperature, the heat capacities of each thermocouple and its lead wire must be reduced not to influence the temperature of the region to be detected. Temperature measurement of a very small region is very difficult, and such difficult temperature measurement must be done for the entire region of the wafer.

The conventional apparatus has difficulties in the heating technique and control technique. For example, when the central portion of the wafer has a lower temperature, if the input to the heater corresponding to the center of the wafer is increased, the temperature in the outer periphery of the wafer also rises under the influence of the center. When the raised temperature in the outer periphery of the wafer is measured and is directly reflected in the control to decrease the input to the outer periphery of the wafer, the input finally becomes zero, and the apparatus can no longer serve as a control system.

As described above, the conventional apparatus has no means for temperature measure and temperature control for a very small region. Also, it is very hard to optimally set a plurality of control systems which influence each other. That is, the central portion of the wafer is set at a relatively lower temperature and the control response is made slightly slow.

Furthermore, in the conventional single-substrate-heat-treatment apparatus, a large temperature difference may result in physical damages on a wafer as the target substrate. In the single-substrate-heat-treatment apparatus, after a wafer is transferred to the processing position in the process chamber one by one, it is heated up to a processing temperature, and is held for a predetermined period of time. After the processing, the wafer is cooled to some extent, and is unloaded from the process chamber using a transfer arm. The maximum temperature difference is produced when the wafer is unloaded by the transfer arm, since the transfer arm is normally at room temperature. Of course, heating the transfer arm is effective for reducing the temperature difference produced upon transferring, but is technically difficult. Also, since the wafer must be finally cooled to room temperature, a temperature difference is produced somewhere even though the temperature difference upon unloading from the process chamber is reduced.

Figure 31:
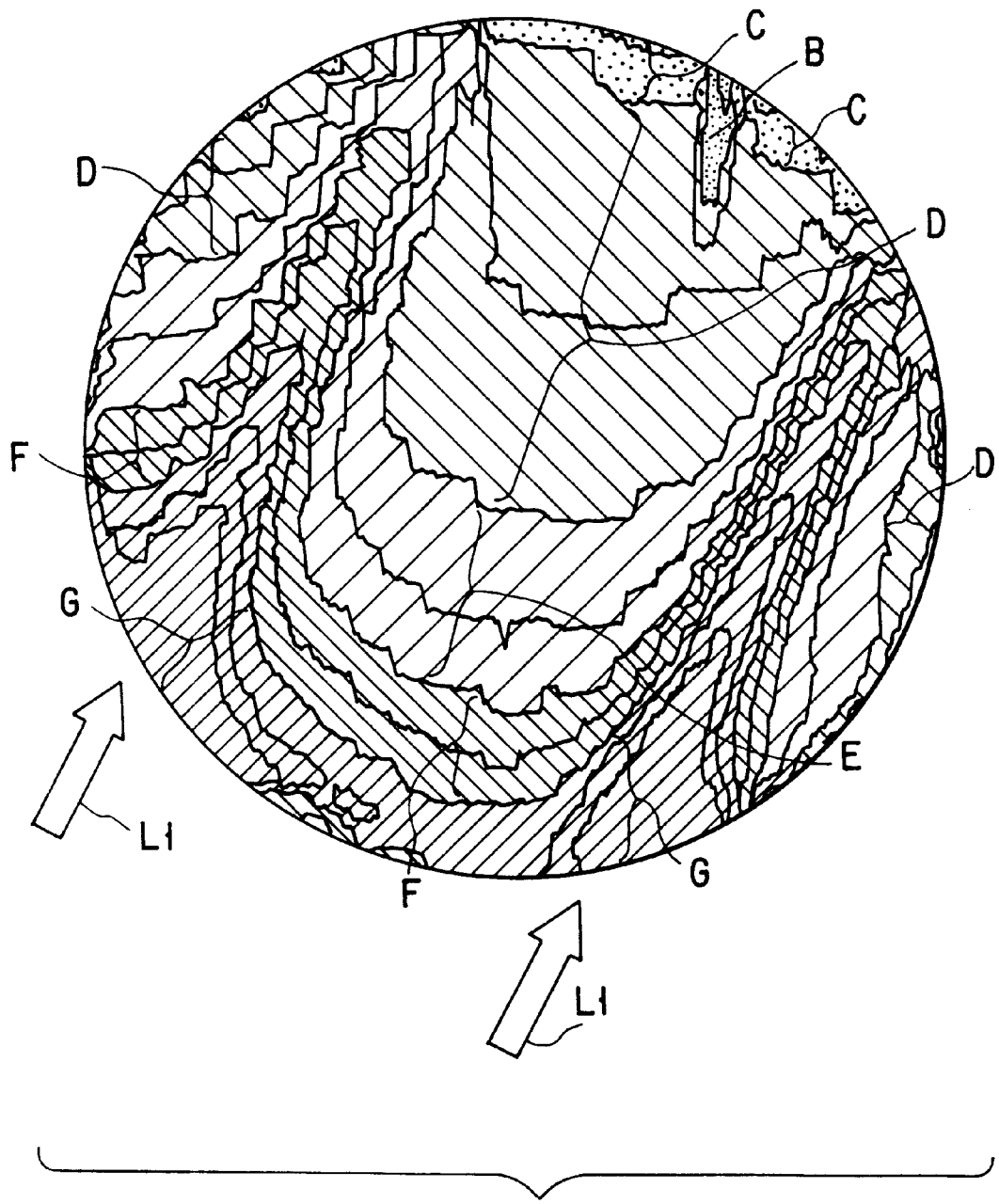
FIG. 31 is a view showing the temperature distribution when a semiconductor wafer has been moved by a transfer arm.

FIG. 31 shows the temperature distribution measured when a semiconductor wafer is transferred using a transfer arm, and represents temperatures by various patterns. FIG. 31 shows data obtained at the instance when a transfer arm (in this case, two glass tubes at room temperature) is inserted underneath a high-temperature wafer from the direction of arrows L1, and lift up the wafer. A large temperature difference is produced around the contact portions between the wafer and arm, and the heat flowing from the wafer periphery disappears at the contact portions. That is, heat flows into the arm. As shown in FIG. 31, the temperature difference itself is large, and if it is considered as a temperature gradient, the wafer is open to damage and slip.

FIG. 31 corresponds to the process upon completion of heat treatment. Also, upon loading a wafer into the process chamber, a similar temperature difference is formed, and seriously disturbs temperature uniformity of the apparatus. In particular, when the wafer size increases to 8 inches or 12 inches to meet recent high-density, high-integration requirements, the temperature control by the conventional apparatus arrangement cannot satisfactorily remove temperature nonuniformity in the wafer surface. Also, the influences of temperature nonuniformity magnify.

An embodiment of the present invention made based on the above-mentioned facts will be described below with reference to the accompanying drawings. Throughout the following description, the same reference numerals denote constituting elements having nearly the same functions and arrangements, and a repetitive description will be avoided unless required.

Figure 22:
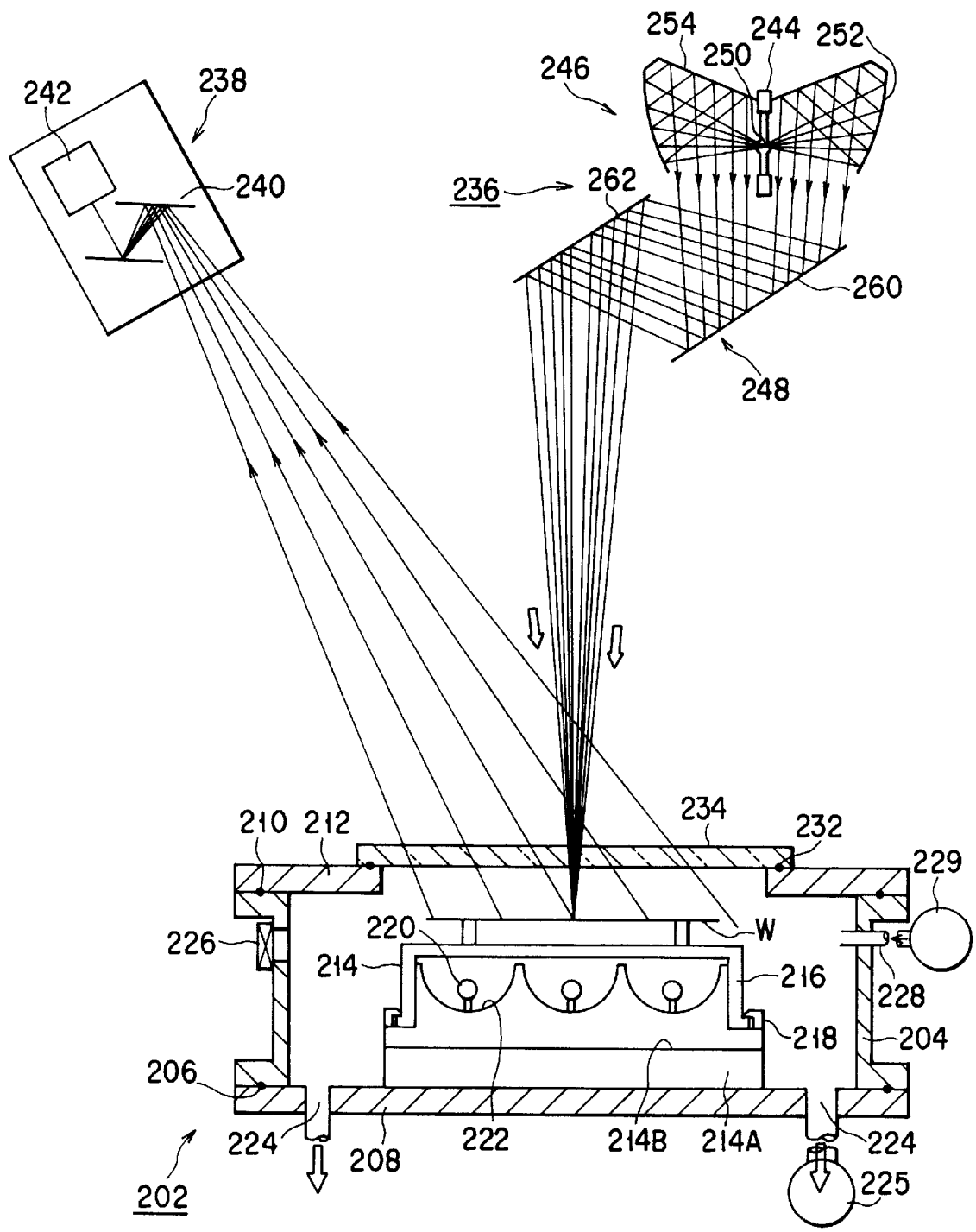
FIG. 22 is a view showing a single-substrate-heat-treatment apparatus according to still another embodiment of the present invention.

FIG. 22 shows a single-substrate-heat-treatment apparatus according to an embodiment of the present invention.

As shown in FIG. 22, a heat-treatment apparatus 202 has a process chamber 204 which is formed into a cylindrical shape by, e.g., aluminum or the like. A bottom plate 208 is air-tightly attached to the bottom portion of the process chamber 204 via a seal member 206 such as an O-ring or the like. Also, a top plate 212 is air-tightly attached to the top portion via a seal member 210 such as an O-ring or the like. In the process chamber 204, a work table 214 for placing, e.g., a semiconductor wafer W as the target substrate is set.

The work table 214 is constructed by a lower base 214A and a work table body 214B set thereon. A cover member 216 consisting of transparent quartz glass is detachably disposed on at least the upper surface of the work table body 214B via a clamp 218. In the work table body 214B, for example, a plurality of heating lamps 220 serving as main heating means formed of, e.g., halogen lamps, are disposed. The wafer W can be mainly heated by the lamps 220 from its back surface side. The input electric power amounts of these lamps 220 can be individually controlled. Beneath the heating lamps 220, reflection mirrors 222 each having a nearly elliptic section or a curved-surface section similar to a parabolic shape are disposed. With this arrangement, light emitted by the lamps 220 can be efficiently input to the back surface of the wafer.

The reflection surface of each reflection mirror 222 has a curved-surface shape which makes light rays that reach the wafer rear surface scatter roughly uniformly, unlike an elliptic or parabolic reflection mirror popularly used. Note that a resistive heater which is divided into a plurality of concentric zones, and can be controlled in units of zones may replace the heating lamps 220.

Exhaust ports 224 connected to a vacuum evacuation system 225 are formed in the bottom plate 208 of the process chamber 204, so that the interior of the process chamber 204 can be evacuated to a vacuum. A gate valve 226 which is opened/closed upon loading/unloading the wafer W is attached to the side surface of the process chamber 204. Also, a gas supply nozzle 228 connected to a gas supply system 229 is inserted into the side wall of the process chamber 204 so as to supply a predetermined process gas.

Also, lifter pins (not shown) for vertically moving the wafer W to convey it may be arranged if necessary. In place of the gas supply nozzle 228, a transparent, quartz shower head may be used.

An opening 230 with a predetermined size larger than the wafer diameter is formed in the top plate 212 of the process chamber 204. A transparent window 234 formed of, e.g., quartz, is air-tightly set on the opening 230 via a seal member 232 such as an O-ring or the like.

Above the transparent window 234, a sub heating mechanism 236 for heating a specific portion of the surface of the wafer W, and a scanning radiation temperature measurement mechanism 238 for measuring the temperature distribution of the wafer surface are disposed.

The scanning radiation temperature measurement mechanism 238 has a pair of scan mirror mechanisms 240 which rotate about, e.g., X- and Y-axes which are perpendicular to each other, and a photodetector 242. By receiving light originating from individual points on the wafer by the photodetector 242 while moving the scan mirror mechanisms 240, the temperature distribution of the entire wafer surface can be two-dimensionally and accurately measured. The temperature distribution shown in FIG. 31 is obtained using such radiation temperature measurement mechanism 238.

The radiation temperature measurement mechanism 238 is commercially available as Thermo Viewer, Thermo Tracer (tradenames), or the like, and has a performance of measuring 256×256 points 20 times per second, and continuously displaying the measurement results as a temperature distribution chart shown in FIG. 31. In the following description, the temperature measurement mechanism 238 will be mentioned as a so-called black box that gives temperature distribution data at high speed, and its measurement method and scanning method will not be described in detail.

The sub heating mechanism 236 is mainly formed of a discharge lamp 244, a focusing mirror unit 246 for focusing light emitted by the discharge lamp 244, and a scanning mirror unit 248 for scanning the light coming from the focusing mirror unit 246 on the surface of the wafer W.

More specifically, a discharge lamp (e.g., a xenon lamp, high-pressure mercury lamp, or the like) that emits light by arc discharge can be used as the discharge lamp 244. The sectional diameter of an emission point 250 (see FIG. 24) produced by arc discharge is around 0.3 mm, and it can be substantially considered as a point. As will be described later, an angular error or divergence angle upon focusing can be decreased.

The focusing mirror unit 246 that focuses light emitted by the discharge lamp 244 is constructed by an elliptic reflection mirror 252 having an elliptic section along the light radiation direction, and a linear reflection mirror having a linear section along the optical axis direction to focus light coming from the mirror 252. With this arrangement, the divergence angle of reflected light can be controlled, and many light rays can be focused to one point on the focal point.

More specifically, the focusing mirror unit 246 can use the same reflection mirror mechanism as that disclosed in co-pending U.S. patent application Ser. No. 09/079,290 filed on May 15, 1998 by the present inventor, the teachings of which are hereby incorporated by reference.

Figure 23:
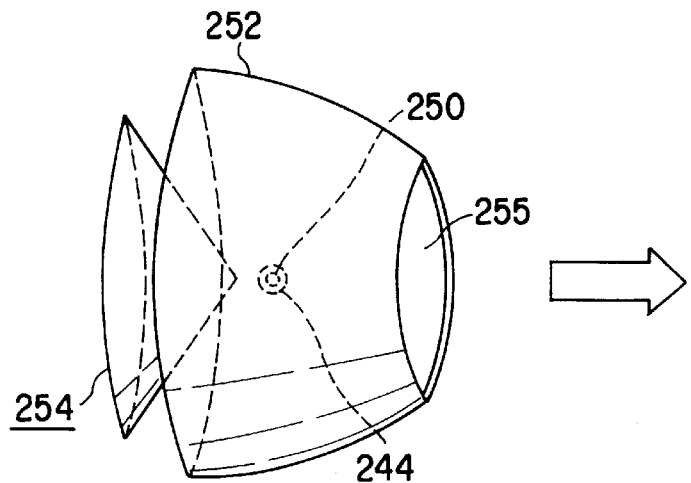
FIG. 23 is a perspective view showing a focusing mirror portion of the apparatus shown in FIG. 22.
Figure 24:
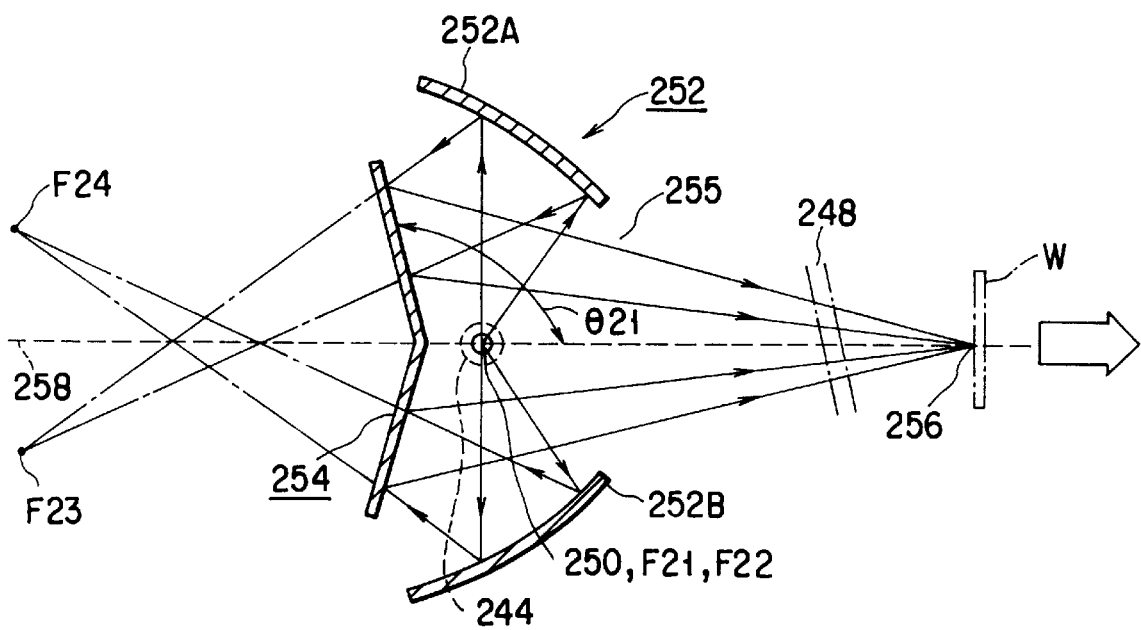
FIG. 24 is an explanatory view for explaining reflection of light by the focusing mirror portion of the apparatus shown in FIG. 22.

More specifically, as shown in FIGS. 23 and 24, the elliptic reflection mirror 252 is formed into, e.g., a dome shape so that its section in the light radiation direction defines a portion of an elliptic shape, and a circular radiation opening 255 having a relatively small diameter is open to its distal end.

By contrast, the linear reflection mirror 254 is formed into an umbrella shape so that its section in the light radiation direction has a linear shape bent at the center, and the entire reflection surface forms a portion of a circular cone of revolution. The emission point 250 of the discharge lamp 244 is set on a focal point F21 of the elliptic shape of the elliptic reflection mirror 252. Hence, after light emitted by the discharge lamp 244 is reflected by the elliptic reflection mirror 252, the light travels toward the linear reflection mirror 254 behind the lamp, and is reflected by the mirror 254. After that, the light travels forward, is output from the radiation opening 255, and is focused to a converging point 256.

In this case, it should be noted that the upper and lower portions of ellipses in FIG. 23, i.e., an upper elliptic arc 252A and lower elliptic arc 252B do not form portions of a continuous single ellipse. More specifically, one focal point of an ellipse that forms the upper elliptic arc 252A is located at the point F22, which is the same point as one focal point of the lower elliptic arc 252B, but the other focal point F23 is located below a central line 258. On the other hand, one focal point of an ellipse that forms the lower elliptic arc 252B is located at the point F22, but the other focal point F24 is located above the central line 258 at a position symmetrical to the focal point F23 about the central line 258.

A tilt angle θ21 the linear reflection mirror 254 makes with the central line 258 is set so that virtual images of the focal points F23 and F24 are located at an identical point, i.e., the converging point 256 if the corresponding straight lines of the section of the linear reflection mirror 254 are defined as symmetry axes (via the scanning mirror unit 248 in this embodiment). In FIG. 23, one section that passes through the central line 258 has been explained. Also, the above-mentioned relation holds for all the sections which are taken along the central line 258 from arbitrary directions.

More specifically, the distance between the elliptic reflection mirror 252 and linear reflection mirror 254 is set so that the converging point 256 is located on the surface of the semiconductor wafer W.

Figure 25:
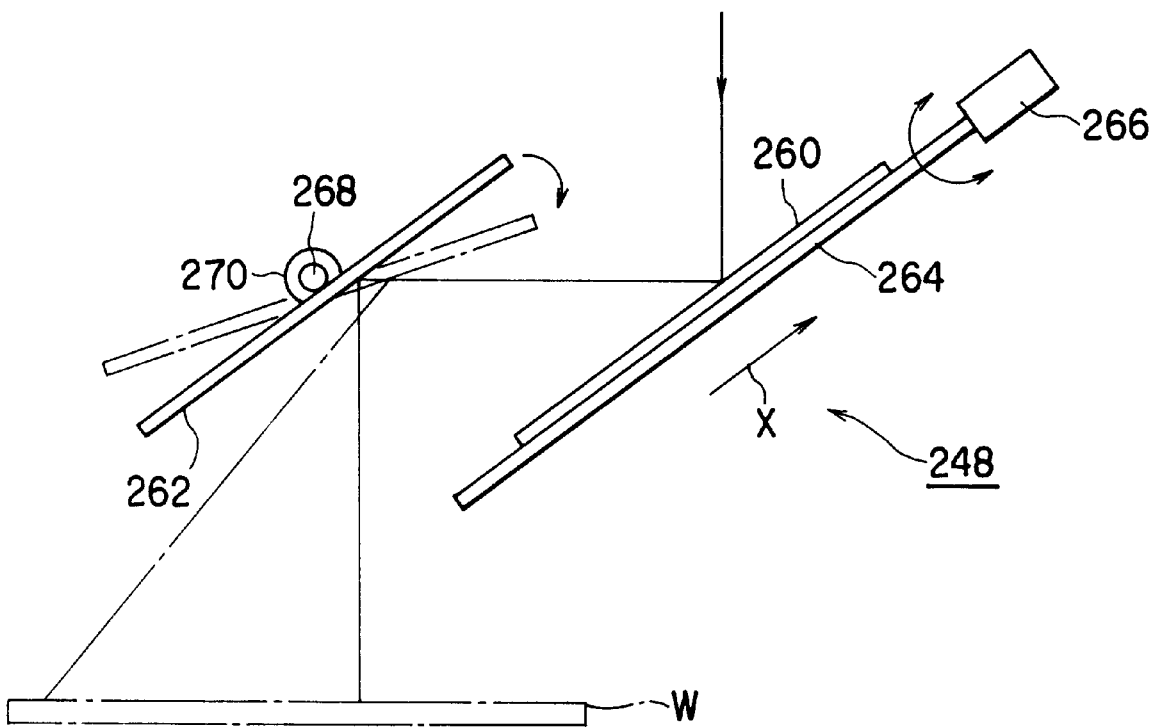
FIG. 25 is a schematic view showing a scanning mirror portion of the apparatus shown in FIG. 22.

The scanning mirror unit 248 has a pair of plane reflection mirrors 260 and 262, as shown in FIG. 25. The reflection mirrors 260 and 262 are set parallel to each other to face each other and to form a parallelepiped. Light originating from the discharge lamp 24 is reflected by one plane reflection mirror 260, and then reaches the other plane reflection mirror 262.

The plane reflection mirror 260 is fixed to an X-rotation shaft 264 which extends along, e.g., the X-direction, and is coupled to an X-motor 266 comprising, e.g., a stepping motor. The plane reflection mirror 260 is rotated and/or swung through an arbitrary angle about the X-rotation shaft 264 by rotating the X-motor 266 in the forward/reverse direction.

The plane reflection mirror 262 is fixed to a Y-rotation shaft 268 which extends in a Y-direction (a direction perpendicular to the plane of the drawing in FIG. 25) perpendicular to the X-direction and is coupled to a Y-motor 270 comprising, e.g., a stepping motor. The plane reflection mirror 262 is rotated and/or swung through an arbitrary angle about the Y-rotation shaft 268 by rotating the Y-motor 270 in the forward/reverse direction.

Hence, using these two plane reflection mirrors 260 and 262, light emitted by the discharge lamp 244 can be moved and brought to a focus to an arbitrary specific portion on the wafer surface.

A halogen lamp using a filament, for example, may be used in place of the discharge lamp 244. However, in this case, the sectional diameter of the emission point to be emitted becomes several mm to ten-odd mm and is considerably larger than that of arc discharge, and the spot diameter of light at the converging point 256 becomes larger accordingly. Hence, the wafer surface is divided into zones based on the increased spot diameter.

The operation of the apparatus shown in FIG. 22 will be explained below.

An unprocessed semiconductor wafer W is loaded into the process chamber 204 using a transfer arm (not shown) via the open gate valve 226, and is placed on the work table 214. After the interior of the process chamber 204 is sealed hermetically, the interior of the process chamber 204 is evacuated to a vacuum, and is maintained at a predetermined pressure. After an elapse of a predetermined period of time, a predetermined process gas is supplied via the gas supply nozzle 228.

At the same time, the main heating lamps 220 arranged inside the work table body 214B begin to project light toward the back surface side of the wafer W to heat it to a predetermined process temperature, and control is done to maintain the temperature.

During heating the wafer W, several (e.g., around 3 to 4) thermocouples (not shown) built in the surface of the work table 214 detect the wafer temperature. The outputs from the heating lamps 220 are controlled to make the values detected by the individual thermocouples constant at the process temperature. However, with this control alone, it is hard to obtain uniform temperature in the wafer surface, as described above, and a certain temperature difference is inevitably produced in the wafer surface.

To prevent this, in this embodiment, the scanning radiation temperature measurement mechanism 238 scans the entire wafer surface to obtain the temperature distribution of the wafer surface. Based on this temperature distribution, a specific portion or position with low temperature is detected (see FIG. 31). After the specific portion with low temperature is detected, the sub heating mechanism 236 emits condensed light toward that specific portion to heat the specific portion to the average temperature value of the wafer surface.

Note that the two-dimensional temperature distribution of the wafer surface is independently and continuously measured by the radiation temperature measurement mechanism 238 at a timing different from scanning for local heating of the wafer. If a means for transferring data from the temperature measurement mechanism 238 is added in addition to a system for controlling the sub heating mechanism 236, for example, the temperature distribution data is obtained while the apparatus is in operation.

As shown in FIG. 23, light emitted by the discharge lamp 244 is reflected by the elliptic reflection mirror 252 arranged in front of the lamp, and travels toward the linear reflection mirror 254 behind the lamp. The light reflected by the linear reflection mirror 254 is brought to a focus to the converging point 256 via the radiation opening 255. Before this light reaches the converging point 256, its direction is determined by the scanning mirror unit 248.

The converging point 256 is set on the surface of the wafer W, and heats a specific portion on the surface of the wafer W, selected by appropriately rotating and/or swinging the two plane reflection mirrors 260 and 262 in the scanning mirror unit 248. Light rays emitted by the discharge lamp 244 over a broad angular range are condensed at the converging point 256. Especially, light rays that travel forward from the discharge lamp 244, except for those traveling toward the radiation opening 256 can be effectively focused and used, thus improving the use efficiency of emitted light. Note that light that travels backward from the discharge lamp 244 is not shown. Normally, since the rear surface side of the light source is in the shade of the light source itself, and light in this portion suffers large converging errors, it cannot be used.

The sectional diameter of the emission point 250 of the discharge lamp is as very small as about 0.3 mm, i.e., can be essentially considered as a point. For this reason, light with high energy density can be obtained as a point spot with a very small diameter on the converging point 256. Consequently, light can be selectively radiated onto only a specific portion with a low temperature and small area to instantaneously raise the temperature of this portion.

Scanning of the sub heat source is controlled so that the irradiation time of a beam spot on the specific portion increases in proportion to the difference between the average temperature of the wafer and the temperature of that portion. With this control, the beam spot can be selectively formed on only a portion with low temperature in the wafer surface to heat that portion, and consequently, a uniform temperature distribution in the entire wafer surface can be obtained.

For example, when a xenon lamp, an emission point 250 of which has a sectional diameter of around 0.3 m, is used, a beam spot having a diameter of nearly 4 mm can be formed on a wafer surface separated 900 mm therefrom. In this case, if the input to the discharge lamp 244 is 75 W (watts), around 20 W of the input energy can be concentrated to reach the wafer surface as a beam spot, and a temperature rise of 1.06° C. can be generated for an irradiation time of $1/1,000$ sec.

Figure 26:
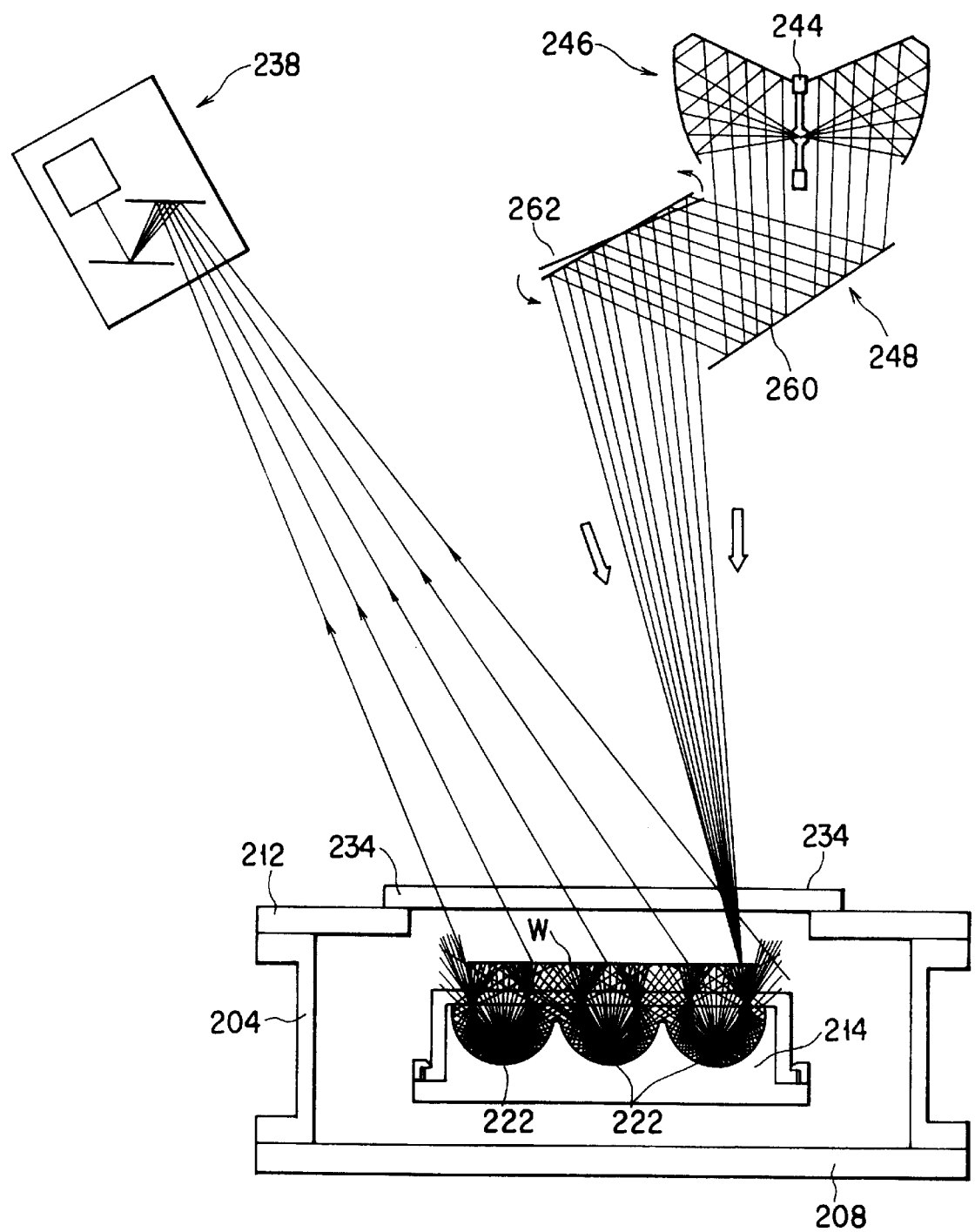
FIG. 26 shows a case wherein a beam spot is radiated onto the right end of the wafer surface by the apparatus shown in FIG. 22.
Figure 27:
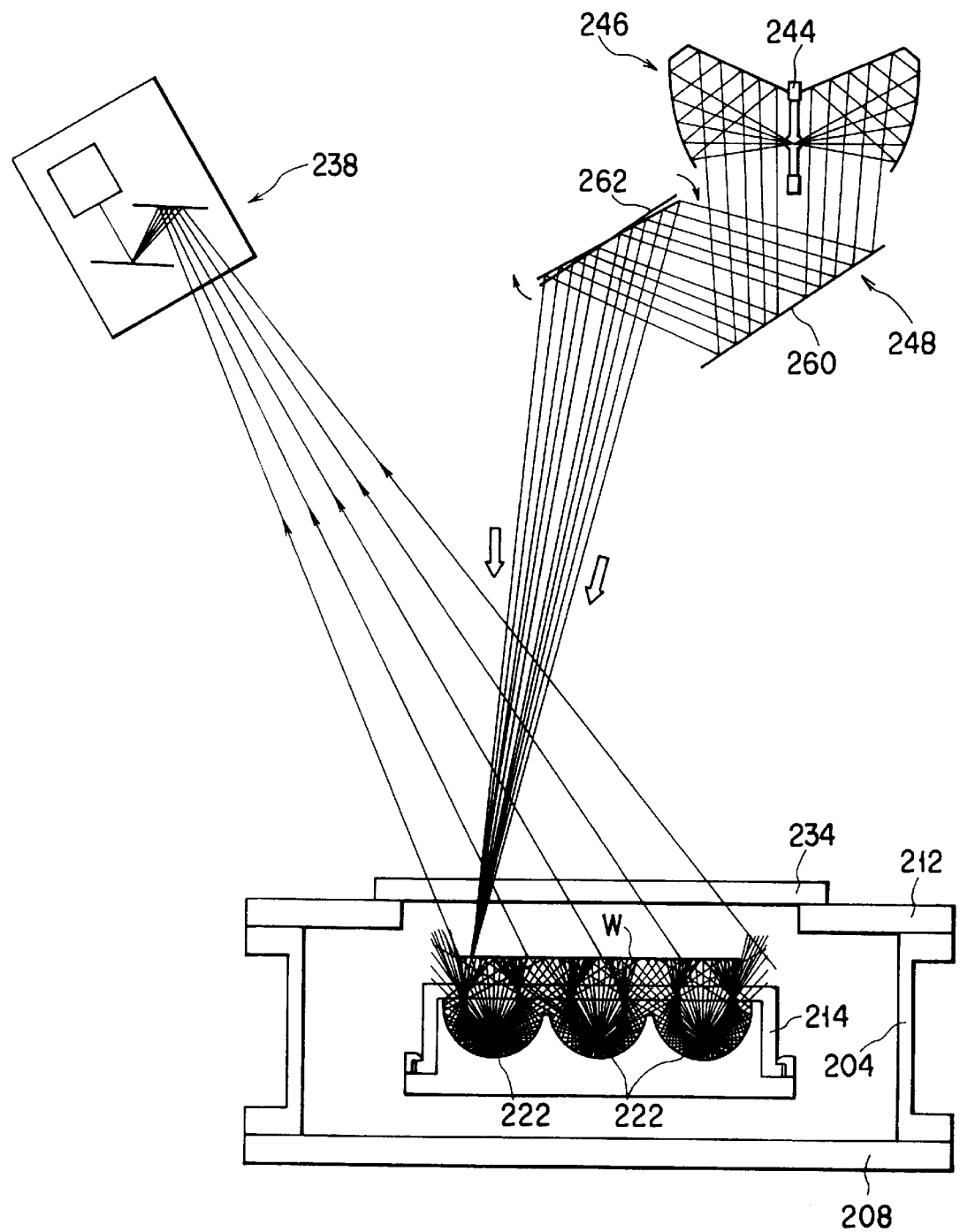
FIG. 27 shows a case wherein a beam spot is radiated onto the left end of the wafer surface by the apparatus shown in FIG. 22.

FIG. 22 shows a case wherein the two plane reflection mirrors 260 and 262 of the scanning mirror unit 248 are moved to radiate a beam spot onto the central portion on the surface of the wafer W. Note that FIG. 22 does not illustrate any light coming from the heating lamps 220 as the main heat source. FIG. 26 shows a case wherein one (262) of the two plane reflection mirrors 260 and 262 is moved to radiate a beam spot onto the right end on the wafer surface. Also, FIG. 27 shows a case wherein the plane reflection mirror 262 is moved to radiate a beam spot onto the left end on the wafer surface.

When the beam spot is to be moved in a direction perpendicular to the plane of the drawing, the other plane reflection mirror 260 is moved. Hence, by appropriately scanning the two plane reflection mirrors 260 and 262, an arbitrary portion in the wafer surface can be irradiated with the beam spot. Note that FIGS. 26 and 27 simply illustrate the arrangement on the process chamber side since it is the same as that shown in FIG. 22.

The two plane reflection mirrors 260 and 262 are moved by a control system (not shown) on the basis of the temperature distribution (heat image data) obtained by the scanning radiation temperature measurement mechanism 238. This control is done so that the time the beam spot stays at a specific portion increases in proportion to the difference between the average temperature of the wafer and the temperature of that A portion. An example of the control method will be explained below.

Figure 28:
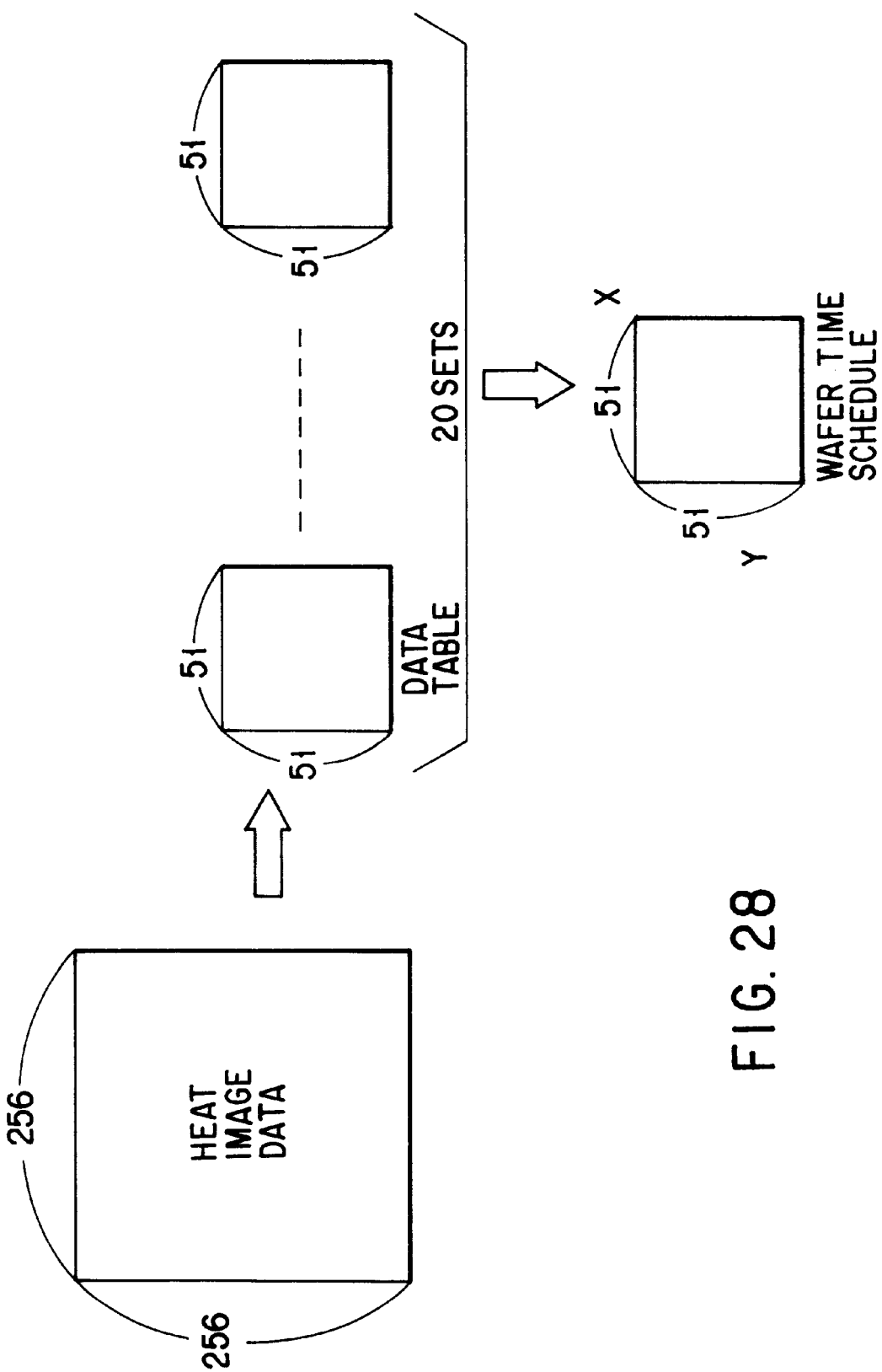
FIG. 28 is a schematic view showing the conversion processes of a measurement value table to explain the control method of the apparatus shown in FIG. 22.

FIG. 28 schematically illustrates the table conversion processes of measurement values to explain the control method. Since the speed and resolution when the radiation temperature measurement mechanism 238 obtains the temperature distribution by scanning the entire surface of the wafer W are normally different from the speed and spot area size when the scanning sub heating mechanism 236 heats the wafer surface by scanning, matching between the two mechanisms must be taken.

For example, assume that processing is done under the following conditions. That is, the scanning radiation temperature measurement mechanism 238 transfers heat image data at 256×256 points of the entire wafer surface, i.e., the temperature values of individual measured points in the order of coordinates at $1/20$ sec intervals. On the other hand, the sub heating mechanism 236 scans and heats 52×52 points (spots) in around 1 sec.

In FIG. 28, heat image data can be considered as a file in, e.g., a personal computer, in which temperature data at 256×256 points are written. Also, 20 sets of data tables and a wafer time schedule can be similarly considered as files. However, the wafer time schedule is interfaced with an electric mirror driving system for scanning the sub heating mechanism 236 in practice.

More specifically, a controller for the motors that drive the scanning mirrors 262 and 262 reads the values in the wafer time schedule in the following order, and reads the next value when a time period corresponding to the written stay time has elapsed:

$$(X1, Y1), (X2, Y1) \cdots (X52, Y1)$$
$$(X1, Y2), (X2, Y2) \cdots (X52, Y2)$$
$$\cdots$$
$$(X1, Y52), (X2, Y52) \cdots (X52, Y52)$$

Every time the X-coordinate of the data to be read is incremented, the controller generates a signal or pulse for rotating the motor, which drives the scanning mirror 262, through a predetermined angle. Also, every time the Y-coordinate of the data to be read is incremented, the controller generates a signal or pulse for rotating the motor, which drives the scanning mirror 260, through a predetermined angle.

In this case, the beam spot is radiated onto a predetermined position for a time period corresponding to the stay time including zero and written at a predetermined coordinate, thus scanning the entire wafer surface.

An example of an algorithm for calculating the wafer time schedule to be looked up once per around one second at 52×52 points from the heat image data of 256×256 points generated at 1/20 sec intervals will be explained below. In actual heating, since the optical axis has different tilts in units of portions, the stay time must be changed, and the region to be irradiated varies depending on the portion of interest on the wafer (e.g., the central portion and peripheral portion). Before actual operation, a conversion table (not shown) is prepared. A predetermined value is written at only a specific coordinate of the wafer time schedule, and the sub heat source heats only the specific coordinate to obtain corresponding heat image data. This data acquisition repeats itself for all the coordinates to analyze the coordinate range of the scanning radiation thermometer in which influences of light irradiation to a specific coordinate are eminent, thus obtaining a conversion table. The contents of the conversion table include a coefficient to be multiplied by the temperature value at each coordinate of the scanning radiation thermometer and the coordinate position of a data table at which the product is to be written.

During actual operation, the average value is calculated based on data obtained by the scanning radiation thermometer, and the differences between individual data and the average value are written in 20 data tables in accordance with the conversion table. Parallel to this operation, the wafer time schedule is reset in synchronism with scanning by the sub heat source, and all data are added to the 20 data tables.

The obtained wafer time schedule includes both values equal to or larger than a given value, and minus values each indicating that the corresponding temperature is higher than the average temperature. Any numerical value larger the given value is set at the given value to prevent overheating. Also, any minus value is set at 0. Note that the 52nd data in the wafer time schedule is assigned to a position separated from the wafer to define an escape position of the beam spot.

In this manner, the beam spot is selectively radiated onto a portion, the temperature of which is lower than the average value. In addition, heating is done by controlling the stay time of the beam spot in correspondence with the degree of "low temperature". For this reason, temperature uniformity in the wafer surface can be greatly improved. Also, shear stress arising from temperature differences of the wafer can be prevented from being produced. Note that the control method described above is merely an example, and the present invention is not limited to such specific method.

Figure 29:
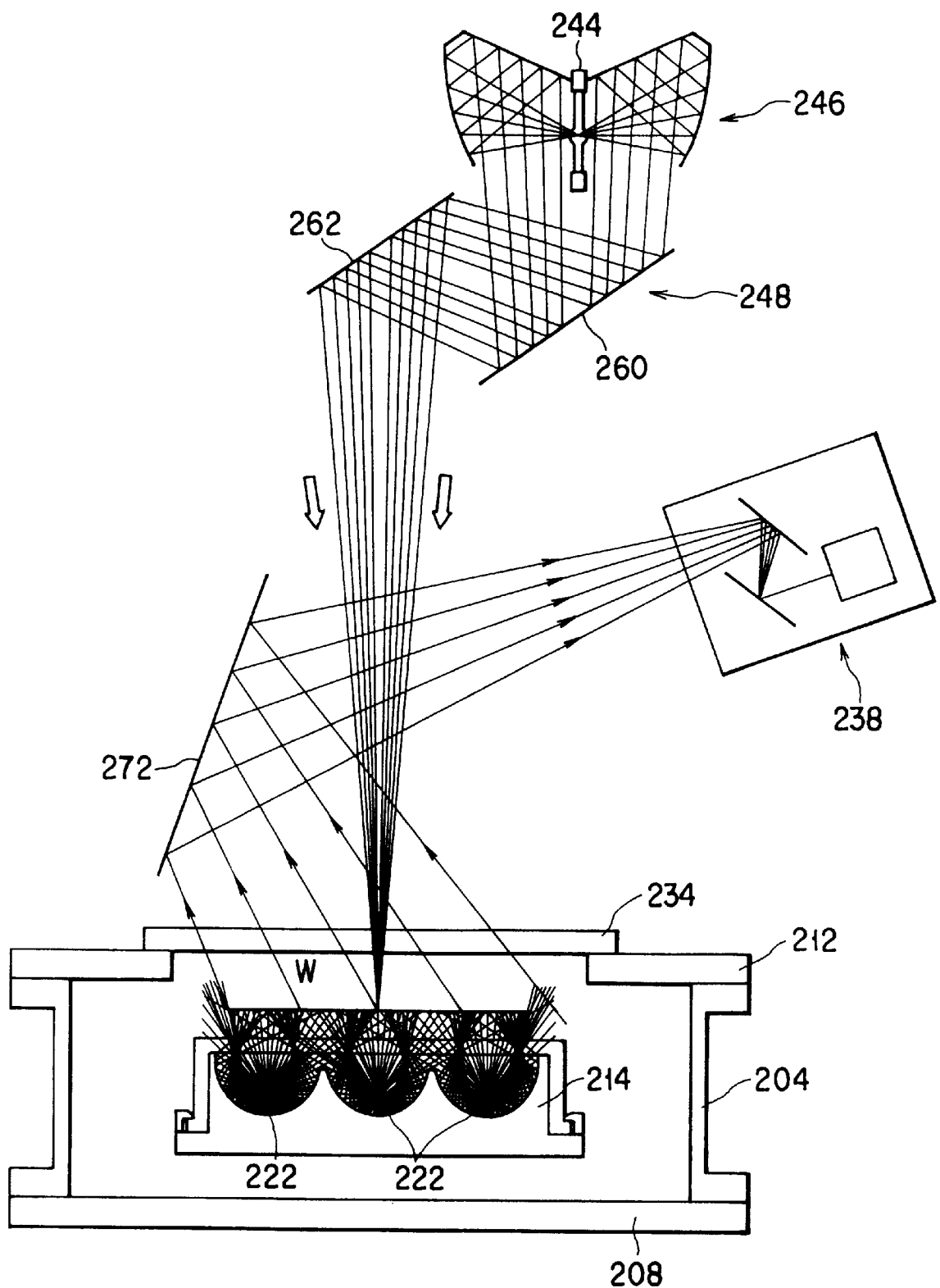
FIG. 29 is a view showing a modification of the apparatus shown in FIG. 22.
Figure 30:
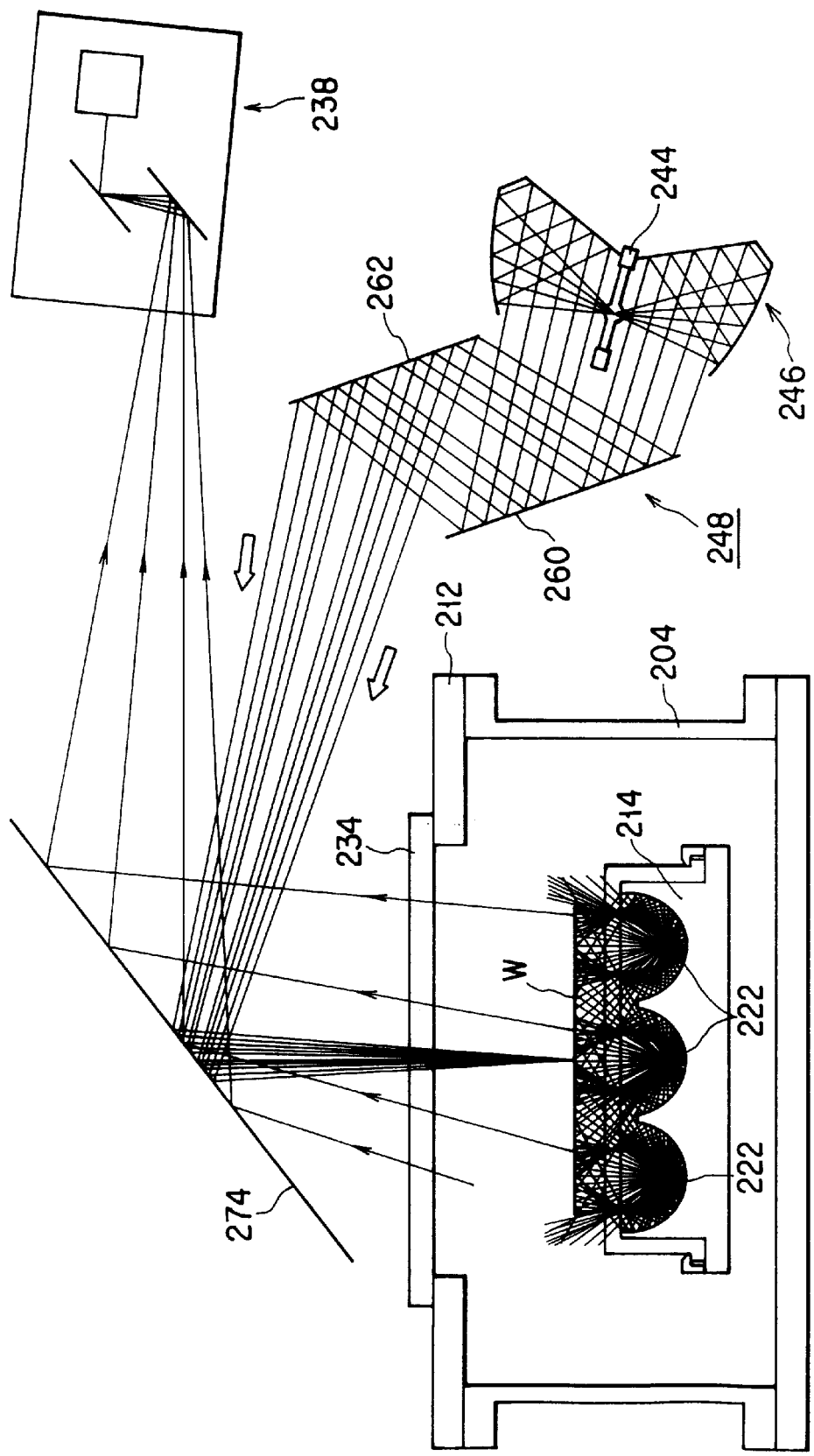
FIG. 30 is a view showing another modification of the apparatus shown in FIG. 22.

In some cases, the radiation temperature measurement mechanism 238 and sub heating mechanism 236 cannot often be set at positions shown in FIG. 22 due to space limitations. In such case, a plane direction-conversion reflection mirror 272 may be obliquely arranged at a position obliquely above the transparent window 234 to locate the radiation temperature measurement mechanism 238 at a position different from that in FIG. 22, as shown in, e.g., FIG. 29. Also, as shown in FIG. 30, a large plane direction-conversion reflection mirror 274 may be set to have a tilt of around 45°, and the radiation temperature measurement mechanism 238 and sub heating mechanism 236 may be set aside the chamber.

As the sub heating mechanism for selectively and locally heating the wafer surface, an arrangement other than the illustrated sub heating mechanism 236 may be used. For example, a heating mechanism for heating the upper surface of the wafer used in the embodiments shown in FIGS. 1 to 17 may be used to construct a sub heating mechanism. When a point-like beam spot is used, the heating mechanism in the embodiments shown in FIGS. 1 to 17 may be modified to use a discharge lamp for generating an emission point as a light source.

As the heat treatment in the embodiment shown in FIGS. 22 to 30, annealing, film formation, oxidation, diffusion, and the like may be done. Furthermore, the target substrate is not limited to a semiconductor wafer, but the present invention may be applied to a glass substrate, LCD substrate, and the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A single-substrate-heat-treatment apparatus in a semiconductor processing system, comprising:

a process chamber formed in a casing with a transparent window;

a support disposed in said process chamber, for supporting a target substrate to face the transparent window;

a light source disposed outside said process chamber, for emitting light to heat the target substrate;

a reflection mirror mechanism for reflecting light emitted by said light source and radiating the reflected light onto the target substrate via the transparent window, said reflection mirror mechanism comprising an objective mirror disposed to focus the light emitted by said light source onto the target substrate; and a scanning mechanism for driving at least one of said support and reflection mirror mechanism to scan the target substrate with the light emitted by said light source;

wherein said reflection mirror mechanism further comprises an intermediate mirror for reflecting the light emitted by said light source and guiding the reflected light toward said objective mirror, said intermediate mirror has an intermediate reflection surface, a section of which along the optical axis direction has an elliptic shape, said light source is located substantially at a position of one of two focal points of the elliptic shape of the intermediate reflective surface, said objective mirror has an objective reflection surface, a section of which along the optical axis direction has a linear shape and which faces the intermediate reflection surface, and the target substrate is located substantially at a position of a virtual image of the other one of the two focal points of the elliptic shape of the intermediate reflection surface to have the linear shape of the objective reflection surface as a symmetry axis.

2. An apparatus according to claim 1, wherein said light source forms an emission point, a section of which along an optical axis direction is substantially a point light source, and the light emitted by said light source is focused on the target substrate as a point spot.

3. An apparatus according to claim 1, wherein said light source forms an emission line, a section of which along an optical axis direction is substantially a point light source, and the light emitted by said light source is focused on the target substrate as a linear spot.

4. An apparatus according to claim 1, wherein said light source comprises a discharge lamp.

5. An apparatus according to claim 1, wherein said light source comprises a filament built-in lamp.

6. An apparatus according to claim 1, wherein said scanning mechanism drives said support while said objective mirror keeps still.

7. An apparatus according to claim 1, wherein said scanning mechanism drives said objective mirror while said support keeps still.

8. An apparatus according to claim 1, wherein said support can rotate the target substrate within a horizontal plane.

9. An apparatus according to claim 1, wherein said process chamber is hermetically sealed, and said apparatus further comprises a supply system for supplying a process gas into said process chamber, and an exhaust system for exhausting an interior of said process chamber.

10. A single-substrate-heat-treatment apparatus in a semiconductor processing system, comprising;
a process chamber formed in a casing with a transparent window;
a support disposed in said process chamber, for supporting a target substrate to face the transparent window;
a main heating mechanism for heating the target substrate;
a scanning radiation temperature measurement mechanism located outside said process chamber, for measuring a temperature distribution of the target substrate via the transparent window; and
a sub heating mechanism for selectively and locally heating the target substrate on the basis of the temperature distribution measured by said radiation temperature measurement mechanism;
wherein said sub heating mechanism comprises a light source which is located outside said process chamber, and emits light for heating the target substrate, and a reflection mirror mechanism for reflecting the light emitted by said light source, and radiating the reflected light onto the target substrate via the transparent window; and wherein said reflection mirror mechanism comprises a first mirror for reflecting the light emitted by said light source, and a second mirror for reflecting light coming from said first mirror and guiding the reflected light toward the target substrate, said first mirror has an elliptic reflection surface, a section of which one an optical axis direction has an elliptic shape, said second mirror has a linear reflection surface, a section of which along the optical axis direction has a linear shape, said light source is located substantially at a position of one of two focal points of the elliptic shape of the elliptic reflection surface, and the target substrate is located substantially at a position of a virtual image of the other one of the two focal points of the elliptic reflection surface to have the linear shape of the linear reflection surface as a symmetry axis.

11. An apparatus according to claim 10, wherein said process chamber is hermetically sealed, and said apparatus further comprises a supply system for supplying a process gas into said process chamber, and an exhaust system for exhausting an interior of said process chamber.

12. An apparatus according to claim 10, wherein said light source comprises a discharge lamp for emitting light by discharge, said discharge lamp forms an emission point, a section of which along an optical axis direction is substantially a point light source, and the light emitted by said discharge lamp is focused on the target substrate as a point spot.

13. An apparatus according to claim 10, wherein said reflection mirror mechanism comprises a pair of plane reflection mirrors which are set to face each other so as to scan the target substrate with the light emitted by said light source, and said pair of plane reflection mirrors are respectively rotatable or swingable about rotation shafts which are orthogonal to each other.

14. An apparatus according to claim 10, wherein said first and second mirrors respectively have another elliptic reflection surface and linear reflection surface, which respectively have substantially the same shapes as the elliptic and linear reflection surfaces and are symmetrical to the elliptic and linear reflection surfaces about the optical axis direction as a symmetry axis, and the two elliptic reflection surfaces share a sole common focal point.

15. An apparatus according to claim 14, wherein the two elliptic reflection surfaces of said first mirror are defined by portions of a curved surface formed into an annular shape, and the two linear reflection surfaces of said second mirrors are defined by portions of a curved surface that forms a portion of a circular cone of revolution.

16. An apparatus according to claim 1, wherein said intermediate mirror and said objective mirror respectively have another intermediate reflection surface and objective reflection surface, which respectively have substantially the same shapes as the intermediate and objective reflection surfaces and are symmetrical to the intermediate and objective reflection surfaces about the optical axis direction as a symmetry axis, and the two intermediate reflection surfaces share a sole common focal point.

17. An apparatus according to claim 16, wherein the two intermediate reflection surfaces of said intermediate mirror are defined by portions of a curved surface formed into an annular shape, and the two objective reflection surfaces of said objective mirrors are defined by portions of a curved surface that forms a portion of a circular cone of revolution.

* * * * *